(12) United States Patent
Kitamura et al.

(10) Patent No.: US 7,800,167 B2
(45) Date of Patent: Sep. 21, 2010

(54) SEMICONDUCTOR DEVICE, BATTERY PROTECTION CIRCUIT AND BATTERY PACK

(75) Inventors: Mutsumi Kitamura, Matsumoto (JP); Akio Sugi, Matsumoto (JP); Naoto Fujishima, Matsumoto (JP); Shinichiro Matsunaga, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 434 days.

(21) Appl. No.: 11/802,917

(22) Filed: May 25, 2007

(65) Prior Publication Data

US 2007/0274110 A1 Nov. 29, 2007

(30) Foreign Application Priority Data

May 29, 2006 (JP) ............................. 2006-147721
Dec. 27, 2006 (JP) ............................. 2006-352911

(51) Int. Cl.
*H01L 31/119* (2006.01)
(52) U.S. Cl. ..................... 257/329; 257/330; 257/331
(58) Field of Classification Search .......... 257/329–331
See application file for complete search history.

(56) References Cited

U.S. PATENT DOCUMENTS

| 4,546,367 | A | 10/1985 | Schutten et al. |
| 4,574,209 | A | 3/1986 | Lade et al. |
| 4,612,465 | A | 9/1986 | Schutten et al. |
| 6,211,551 | B1 | 4/2001 | Suzumura et al. |
| 6,373,101 | B1 | 4/2002 | Suzumura et al. |
| 6,580,126 | B1 | 6/2003 | Suzumura et al. |
| 2002/0179928 | A1* | 12/2002 | Fujishima ................... 257/163 |
| 2004/0256666 | A1* | 12/2004 | Fujishima et al. ........... 257/329 |
| 2005/0142713 | A1* | 6/2005 | Fujishima et al. ........... 438/197 |
| 2005/0179081 | A1* | 8/2005 | Kitamura et al. ............ 257/329 |
| 2006/0166419 | A1* | 7/2006 | Shimoyama et al. ........ 438/173 |

FOREIGN PATENT DOCUMENTS

| JP | S59-5673 | 1/1984 |
| JP | S59-5674 | 1/1984 |
| JP | 11-224950 | 8/1999 |
| JP | 2004-274039 | 9/2004 |

OTHER PUBLICATIONS

M. Sawada, M. Iwaya, A. Sugi, K. Takagiwa, S. Matsunaga, M. Sugimoto, N. Fujishima, "A Single Chip Li-ion Battery Protection IC using High Side N-channel Bi-directional Trench Lateral Power MOSFETs".

* cited by examiner

*Primary Examiner*—Zandra Smith
*Assistant Examiner*—Telly D Green
(74) *Attorney, Agent, or Firm*—Rabin & Berdo, P.C.

(57) ABSTRACT

A bidirectional Trench Lateral Power MOSFET (TLPM) can achieve a high breakdown voltage and a low on-resistance. A plurality of straight-shaped islands having circular portions at both ends are surrounded by a trench arrangement. The islands provide first n source regions and a second n source region is formed on the outside of the islands. With such a pattern, the breakdown voltage in the case where the first n source regions are at a high potential can be higher than the breakdown voltage in the case where the second n source region is at a high potential. Alternatively, in the case of not changing the breakdown voltage, the on-resistance can be reduced.

13 Claims, 14 Drawing Sheets

SEMICONDUCTOR DEVICE, BATTERY PROTECTION CIRCUIT AND BATTERY PACK

CROSS-REFERENCE RELATED APPLICATIONS

This application claims the benefit of priority under 35 USC 119 of Japanese applications number 2006-147721, filed May 29, 2006, and 2006-352911, filed Dec. 27, 2006, the disclosures of which are incorporated herein by reference.

BACKGROUND OF THE INVENTION

1. Field of the Invention

The present invention relates to a semiconductor device, a battery protection circuit and a battery pack, and in particular the semiconductor device relates to a bidirectional power Metal-Oxide-Semiconductor-Field-Effect Transistor (hereinafter referred to as MOSFET).

2. Related Art

A battery pack is frequently used as a power supply for mobile devices such as mobile phones and the like and for information equipment such as personal computers and the like. FIG. 14 is a block diagram showing the configuration of a battery pack 40. In the drawings, a charger 50 is shown charging a battery 41 of the battery pack 40. In normal use, a load such as circuitry of a mobile device is connected to the battery pack 40 instead of the charger 50.

When the battery pack 40 is used as the power supply for a mobile device and the like, electric power is supplied to the mobile device (which is not illustrated) through input-output terminals Pack+ and Pack− of the battery pack 40. On the other hand, a positive electrode (the high potential side) of the charger 50 is connected to the plus side input-output terminal Pack+ of the battery pack 40 so that current flows from the charger 50 into a positive electrode (the plus side) of the battery 41 when the battery 41 are charged. The plus side input-output terminal Pack+ is connected to the positive electrode of the battery 41.

The battery pack 40 includes the battery 41 and a battery protection Integrated Circuit (hereinafter referred to as IC) 30. The battery protection IC 30 consists of a bidirectional lateral power MOSFET 31 functioning as a battery protection switch and a control circuit section 32 controlling the bidirectional lateral power MOSFET 31. The bidirectional lateral power MOSFET 31 consists of two nMOSFETs 33 and 34 and two diodes 35 and 36.

The source and the drain of the nMOSFET 33 disposed on the right side in FIG. 14 are respectively connected to the anode and the cathode of the diode 35. The source and the drain of the nMOSFET 34 disposed on the left side in FIG. 14 are respectively connected to the anode and the cathode of the diode 36. In this manner an FET and a diode are connected in parallel and polarity is reversed to a normal connection, and the connection is referred to as an inverse-parallel connection.

In addition, in the bidirectional lateral power MOSFET 31, when the nMOSFET 33 disposed on the right side is distinguished from the nMOSFET 34 disposed on the left side, the nMOSFET 33 and the nMOSFET 34 are described respectively as the right nMOSFET 33 and the left nMOSFET 34. The diode 35 and the diode 36 are described respectively as the right diode 35 and the left diode 36 as well as the right nMOSFET 33 and the left nMOSFET 34. The drain of the right nMOSFET 33 is connected to the drain of the left nMOSFET 34. In this manner it is referred to as anti-series connection, in which the two FETs are connected in series and are connected so that polarity is reversed to a normal connection.

A source terminal S1 (hereinafter referred to as the first source terminal S1) of the right nMOSFET 33 is connected to the minus side input-output terminal Pack−. A source terminal S2 (hereinafter referred to as the second source terminal S2) of the left nMOSFET 34 is connected to negative pole (the minus side) of the battery 41. A gate terminal G1 (hereinafter referred to as the first gate terminal G1) of the right nMOSFET 33 and the gate terminal G2 (hereinafter referred to as the second gate terminal G2) of the left nMOSFET 34 are connected to the control circuit section 32. The right nMOSFET 33 and the left nMOSFET 34 are controlled by the control circuit section 32.

The positive pole (the plus side) of the battery 41 is connected to the plus side input-output terminal Pack+. The load (such as a mobile-phone) and the charger 50 for charging the battery are connected to these input-output terminals Pack+ and Pack−. The control circuit section 32 is connected to the plus side input-output terminal Pack+ of the battery pack 40 through a resistor which is not illustrated. In addition, the control circuit section 32 is connected to the minus side input-output terminal Pack− through a resistor (which is not illustrated). A bidirectional Trench Lateral Power MOSFET (hereinafter referred to as TLPM) can be applied as the bidirectional lateral power MOSFET 31. The structure of the bidirectional TLPM will now be explained.

FIG. 15 is a cross sectional view showing a principle part of a bidirectional TLPM. FIG. 16 is a circuit diagram showing an equivalent circuit of the bidirectional TLPM shown in FIG. 15. FIG. 17 is a plane view showing a principle part of a conventional bidirectional TLPM. FIG. 15 is a cross sectional view along the line segment X-X of FIG. 17.

As shown in FIG. 16, a bidirectional TLPM 20 includes two input-output terminals (the first source terminal S1 and the second source terminal S2) and two gate terminals (the first gate terminal G1 and the second gate terminal G2). When both the first nMOSFET 21 and the second nMOSFET 22 are in an on state, current flows to the bidirectional TLPM 20 even if voltage is applied to either the input-output terminal S1 or S2. When both the first nMOSFET 21 and the second nMOSFET 22 are in an off state, current does not flow to the bidirectional TLPM 20 even if voltage is applied to either the input-output terminal S1 or S2.

As shown in FIGS. 15 and 16, the bidirectional TLPM 20 is a four-terminal element having the first and the second source terminals S1 and S2 and the first and the second gate terminals G1 and G2. The two MOSFETs 21 and 22 have a common drain region 4. A method for manufacturing of the bidirectional TLPM 20 will now be explained with reference to FIG. 15.

At first an n well region 2 is formed in a surface layer of a p substrate 1. Subsequently, by ion implantation and thermal diffusion, a p base region is formed in a surface layer of the n well region 2. Subsequently a trench 3 reaching the n well region 2 through the p base region from a surface of the p base region is formed. The p base region is divided by the trench 3, and thereby the p base region becomes a first p base region 10 and a second p base region 11. The first p base region 10 and the second p base region 11 are formed respectively by a surface layer of a first n silicon pillar 8 of a trench remaining portion and a surface layer of a second n silicon pillar 9 of the trench remaining portion.

Subsequently, the common n drain region 4 is formed in the bottom of the trench 3 by ion implantation and thermal diffusion. Subsequently, a gate insulation film 5 is formed by thermal oxidation, and a first gate electrode 6 and a second gate electrode 7 are formed on respective portions of the gate insulation film 5 at the same time. Subsequently, by ion implantation and thermal diffusion, a first n source region 12 and a second n source region 14 are formed respectively in a surface layer of a first p base region 10 and a surface layer of a second p base region 11, and are formed in contact with the sidewall of trench 3.

In addition, a first base contact region 13 and a second base contact region 15 are formed respectively in a surface layer of the first p base region 10 and a surface layer of the second p base region 11 at the same time. Subsequently the trench 3 is buried with an interlayer insulation film 18. Subsequently a first source electrode 16 in contact with both the first n source region 12 and the first base contact region 13 and a second source electrode 17 in contact with both the second n source region 14 and a second base contact region 15 are formed at the same time.

The first source electrode 16 and the second source electrode 17 are connected respectively to the first source terminal S1 and the second source terminal S2. In addition, the first gate electrode 6 and the second gate electrode 7 are connected respectively to the first gate terminal G1 and the second gate terminal G2. In the bidirectional TLPM 20 fabricated as described above, a first nMOSFET 21 consists of a first n source region 12, the first p base region 10 and the common n drain region 4.

A second nMOSFET 22 consists of the n source region 14, the second p base region 11 and the common n drain region 4. In addition, a first diode 23 connected in inverse parallel to the first nMOSFET 21 consists of the first base contact region 13, the first p base region 10 and the common n drain region 4. A second diode 24 connected in inverse parallel to the second nMOSFET 22 consists of the second base contact region 15, the second p base region 11 and the common n drain region 4.

As shown in FIG. 17, the first n source region 12 is on the inside of the trench 3, which is configured as a closed curve. The first gate electrode 6 (which is not illustrated in FIG. 17) is disposed on an inner sidewall of the trench 3, and the second gate electrode 7 (which is not illustrated in FIG. 17) is disposed on an outer sidewall of the trench 3. The second n source region 14 is also located by the outer sidewall. In this structure, since an electric field is concentrated in the section B when the potential of the first n source region 12 is higher than that of the second n source region 14, the off breakdown voltage of the second nMOSFET 22 is determined in the section B due to an avalanche breakdown being caused.

On the other hand, since the electric field is concentrated in the section A when potential of the second n source region 14 is higher than that of the first n source region 12, the off breakdown voltage of the first nMOSFET 21 is determined in the section A due to an avalanche breakdown being caused. In other words, since there are sections (the section A and the section B) where the electric field concentrates in the first n source region 12 and the second n source region 14, the off breakdown voltage is determined thereby.

Japanese Patent Laid-Open number 59-5673 (Patent literature 1) discloses a lateral bidirectional FET in which a source region and a channel area are respectively separated to two areas by a notch extending to a drift region and a gate means is provided in the notch. Japanese Patent Laid-Open number 59-5674 (Patent literature 2) discloses a planar-type bidirectional FET in which a gate is divided. Japanese Patent Laid-Open number 2004-274039 (Patent literature 3) discloses a method in which an on-state voltage can be reduced in a high breakdown voltage in a trench-type bidirectional TLPM. Japanese Patent Laid-Open number 11-224950 (Patent literature 4) discloses a planar-type and a lateral-type bidirectional FET.

The operation of the configuration shown in FIG. 14 will now be explained for the case where the battery 41 is charged from the charger 50. When the charger 50 is connected to the battery pack 40 in the proper polarity, the voltage of the charger 50 is applied so that the plus side input-output terminal Pack+ of the battery pack 40 becomes a high potential and the minus side input-output terminal Pack- becomes a low potential. If the battery system has a rated output voltage of 20 V, the first source terminal S1 of the bidirectional lateral power MOSFET 31 is at 0 V, and the voltage of (20 V−4.2 V=15.8 V) that subtracted the voltage of the battery 41 (for example, 4.2 V that is taken as an overcharge) from the voltage of the charger 50 is applied to the second source terminal S2 at the maximum.

On the other hand, it is necessary for the battery pack not to be damaged when the polarity of the charger 50 is connected in reverse by mistake. In that case, the maximum voltage applied to bidirectional lateral power MOSFET 31 is 20 V+4.2 V=24.2 V since the voltage of battery 41 is added to the voltage of the charger 50. The voltage of 24.2 V is applied to the bidirectional lateral power MOSFET 31 so that the first source terminal S1 becomes plus and the second source terminal S2 becomes minus.

When the charger 50 is connected in proper polarity, the left nMOSFET 34 does not share the voltage since the left diode 36 is forward biased. Thus, a voltage of 15.8 V is applied to the right nMOSFET 33. On the other hand, because the right diode 35 is forward biased when the charger 50 is connected in reverse polarity, the right nMOSFET 33 does not share the voltage. Thus, a voltage of 24.2 V is applied to the left nMOSFET 34.

In other words, the breakdown voltages of the right nMOSFET 33 and the left nMOSFET 34 do not have to be always the same. The battery pack 40 can be used even if the breakdown voltage when the second source terminal S2 becomes high potential and the first source terminal S1 becomes low potential (namely the breakdown voltage of the right nMOSFET 33) is lowered, and even if the breakdown voltage when the second source terminal S2 becomes low potential and the first source terminal S1 becomes high potential (namely the breakdown voltage of the left nMOSFET 34) is made high.

In addition, the operation will be explained in the case where the charger 50 cannot be connected to the battery pack 40 in reverse polarity. When the second source terminal S2 becomes high potential and the first source terminal S1 becomes low potential, the first source terminal S1 is at 0 V, and the voltage of 15.8 V is applied to the second source terminal S2 at the maximum. In other words, the voltage of 15.8 V is applied to the right nMOSFET 33 at the maximum.

When the first source terminal S1 becomes high potential and the second source terminal S2 becomes low potential, the second source terminal S2 is at 0 V, and the voltage of 4.2 V is applied to the first source terminal S1 at the maximum. In other words, the voltage of 4.2 V is applied to the left nMOSFET 34 at the maximum. Thus, even if the breakdown voltage of the right nMOSFET is made high and the breakdown voltage of the left nMOSFET 34 is lowered, the battery pack 40 can be used.

However, in the conventional bidirectional TLPM, the breakdown voltages of two MOSFETs composing the bidirectional FET are designed equal. Therefore the width of the trench is enlarged more than required, and the curvature (reciprocal of radius of curvature) of the circular portions such section A or B as shown FIG. 17 of the plane pattern of the trench shrinks. Since the current path becomes long when the width of trench becomes wide, and in addition, the channel density is reduced due to radius of curvature, which grows big when the curvature of the circular portion in the plane pattern of the trench becomes small, there is the problem that on-resistance becomes high.

On the contrary, in the case where the breakdown voltages of two MOSFETs are put together in the breakdown voltage of a low one, the breakdown voltage is insufficient when the charger 50 is connected to the battery pack 40 in reverse polarity. Therefore the bidirectional lateral power MOSFET 31 enters into the avalanche mode and there is a danger that the battery pack 40 might not operate safely. In addition, it is not described in the above Patent literatures 1 through 4 that a trade off of on-resistance and the breakdown voltage is improved by making the breakdown voltages of a bidirectional element asymmetry.

SUMMARY OF THE INVENTION

The purpose of the present invention is to provide a semiconductor device which can lower the on-resistance while securing a high breakdown voltage to solve the problems of the prior art described above. In addition, the purpose of the present invention is to provide a battery protection circuit and a battery pack using such a semiconductor device.

The semiconductor device according to a first aspect of the invention is characterized by including a first transistor, a second transistor which is connected to the first transistor in series so that a direction of an on-state current of the second transistor is reversed to that of the first transistor, a first diode which is connected to the first transistor in parallel so that the direction of a forward current of the first diode is reversed to the direction of the on-state current of the first transistor, a second diode which is connected to the second transistor in parallel so that the direction of the forward current of the second diode is reversed to the direction of the on-state current of the second transistor, a first principle electrode which is formed on an end of the side of the first transistor of a series circuit of the first transistor and the second transistor, and a second principle electrode which is formed on an end of the side of the second transistor of the series circuit of the first transistor and the second transistor, wherein a breakdown voltage of the first transistor is different from that of the second transistor.

The semiconductor device according to a second aspect of the invention is characterized by including a trench formed in a surface layer of a semiconductor layer of a first conductivity type, a first gate electrode formed on a first sidewall of the trench through a gate insulation film, a first base region of a second conductivity type formed in a surface layer of a first trench remaining portion in which the trench in contact with the first sidewall is not formed, the first base region formed in contacted with the trench, a first source region of the first conductivity type formed in a surface layer of the first base region and formed in contact with the trench, a first contact region of the second conductivity type formed in the surface layer of the first base region, a first principle electrode connected to the first source region and the first contact region, a second gate electrode formed on a second sidewall of the trench opposite to the first sidewall through the gate insulation film, a second base region of a second conductivity type formed in a surface layer of a second trench remaining portion in which the trench in contact with the second sidewall is not formed, the second base region formed in contacted with the trench, a second source region of the first conductivity type formed in a surface layer of the second base region and formed in contact with the trench, a second contact region of the second conductivity type formed in the surface layer of the second base region, a second principle electrode connected to the second source region and the second contact region, and a common drain region of the first conductivity type formed in the semiconductor layer of the bottom of the trench, wherein a breakdown voltage of the first transistor controlled by the first gate electrode is different from that of the second transistor controlled by the second gate electrode.

The semiconductor device according to a third aspect of the invention is characterized by including a trench formed in a surface layer of a semiconductor layer of a first conductivity type, a first gate electrode formed on a first sidewall of the trench through a gate insulation film, a first base region of a second conductivity type formed in a surface layer of a first trench remaining portion in which the trench in contact with the first sidewall is not formed, the first base region formed in contacted with the trench, a first drain region of the first conductivity type formed in a surface layer of the first base region and formed in contact with the trench, a first principle electrode connected to the first drain region, a second gate electrode formed on a second sidewall of the trench opposite to the first sidewall through the gate insulation film, a second base region of the second conductivity type formed in a surface layer of a second trench remaining portion in which the trench in contact with the second sidewall is not formed, the second base region formed in contacted with the trench, a second drain region of the first conductivity type formed in a surface layer of the second base region and formed in contact with the trench, a second principle electrode connected to the second drain region, a common source region of the first conductivity type formed in the semiconductor layer of the bottom of the trench, a base contact region of the second conductivity type formed in the semiconductor layer of the bottom of the trench, and a conductive film connected to the common source region and the base contact region, wherein a breakdown voltage of the first transistor controlled by the first gate electrode is different from that of the second transistor controlled by the second gate electrode.

The semiconductor device according to a fourth aspect of the invention is characterized in that, in the second aspect of the invention, the first conductivity type is an n type and the second conductivity type is a p type, a plane pattern shape of the trench is a closed curve, a plane pattern shape of the first trench remaining portion is surrounded by the closed curve and is a shape comprising a straight-line portion and circular portions in both ends, and a plane pattern shape of the second trench remaining portion is circularity surrounding the first trench remaining portion.

The semiconductor device according to a fifth aspect of the invention is characterized in that, in the third aspect of the invention, the first conductivity type is an n type and the second conductivity type is a p type, a plane pattern shape of the trench is a closed curve, a plane pattern shape of the second trench remaining portion is surrounded by the closed curve and is a shape comprising a straight-line portion and circular portions in both ends, and a plane pattern shape of the first trench remaining portion is circularity surrounding the second trench remaining portion.

The semiconductor device according to the sixth aspect of the invention is characterized in that, in the second aspect of the invention, the first conductivity type is a p type and the second conductivity type is an n type, a plane pattern shape of the trench is a closed curve, a plane pattern shape of the second trench remaining portion is surrounded by the closed curve and is a shape comprising a straight-line portion and circular portions in both ends, a plane pattern shape of the first trench remaining portion is circularity surrounding the second trench remaining portion.

The semiconductor device according to the seventh aspect of the invention is characterized in that, in the third aspect of the invention, the first conductivity type is a p type and the second conductivity type is an n type, a plane pattern shape of the trench is a closed curve, a plane pattern shape of the first trench remaining portion is surrounded by the closed curve and is a shape comprising a straight-line portion and circular portions in both ends, and a plane pattern shape of the second trench remaining portion is circularity surrounding the first trench remaining portion.

A battery protection circuit according to the eighth aspect of the invention, the battery protection circuit having the semiconductor device according to any one of the aspects 4 through 7, is characterized in that the second principle electrode of the semiconductor device is connected to a minus side of a battery.

A battery pack according to the ninth aspect of the invention, the battery pack comprising a battery protection circuit, a battery and the semiconductor device according to any one of the aspects 1 through 7, is characterized in that a minus side input-output terminal of the battery pack is connected to the first principle electrode, and a minus side terminal of the battery is connected to the second principle electrode.

A battery pack according to the tenth aspect of the invention, the battery pack comprising a battery protection circuit having the semiconductor device according to the aspect 1 and a battery which a minus side terminal of the battery is connected to the second principle electrode of the semiconductor device, is characterized in that an anode of the first diode of the semiconductor device is connected to an anode of the second diode of the semiconductor device, and the breakdown voltage of the second transistor of the semiconductor device is lower than that of the first transistor of the semiconductor device.

A battery pack according to the eleventh aspect of the invention, the battery pack comprising a battery protection circuit having the semiconductor device according to the aspect 1 and a battery which a minus side terminal of the battery is connected to the second principle electrode of the semiconductor device, is characterized in that a cathode of the first diode of the semiconductor device is connected to a cathode of the second diode of the semiconductor device, and the breakdown voltage of the first transistor of the semiconductor device is lower than that of the second transistor of the semiconductor device.

The battery pack according to the twelfth aspect of the invention is characterized in that, in the aspect 10, three expressions $0<V1min<V1max<V0$, $BV1 \geqq V0+V1max$, and $BV2 \geqq V0-V1min$ are satisfied when a voltage of a power supply connected between a plus side terminal of the battery and the first principle electrode of the semiconductor device is expressed as $V0$, a maximum voltage and a minimum voltage of the battery are respectively expressed as $V1max$ and $V1min$, and the first transistor breakdown voltage and the second transistor breakdown voltage of the semiconductor device are respectively expressed as $BV1$ and $BV2$.

The battery pack according to the thirteenth aspect of the invention is characterized in that, in the aspect 11, three expressions $0<V1min<Vmax<V0$, $BV1 \geqq V0-V1min$, and $BV2 \geqq V0+V1max$ are satisfied when a voltage of a power supply connected between a plus side terminal of the battery and the first principle electrode of the semiconductor device is expressed as $V0$, a maximum voltage and a minimum voltage of the battery are respectively expressed as $V1max$ and $V1min$, and the first transistor breakdown voltage and the second transistor breakdown voltage of the semiconductor device are respectively expressed as $BV1$ and $BV2$.

According to the semiconductor device, the battery protection circuit and the battery pack according to the present invention, it is advantageous that on-resistance can be reduced by making the breakdown voltage of the bidirectional element being the battery protection electric switch asymmetry. In addition, it is advantageous that the breakdown voltage can be made high when on-resistance is not changed.

DETAILED DESCRIPTION OF THE PREFERRED EMBODIMENTS

Preferred embodiments of a semiconductor device, a battery protection circuit and a battery pack according to the invention will now be explained in detail with reference to the attached drawings. In addition, in the following explanation of each embodiment and in the attached drawings, the same symbols are used to indicate the same or similar elements and redundant explanation are omitted. Moreover, in the following explanation of each embodiment and the attached drawings, S1, S2, D1, D2, G1 and G2 indicate respectively a first source terminal, a second source terminal, a first drain terminal, a second drain terminal, a first gate terminal, and a second gate terminal.

First Embodiment

Figure 1:
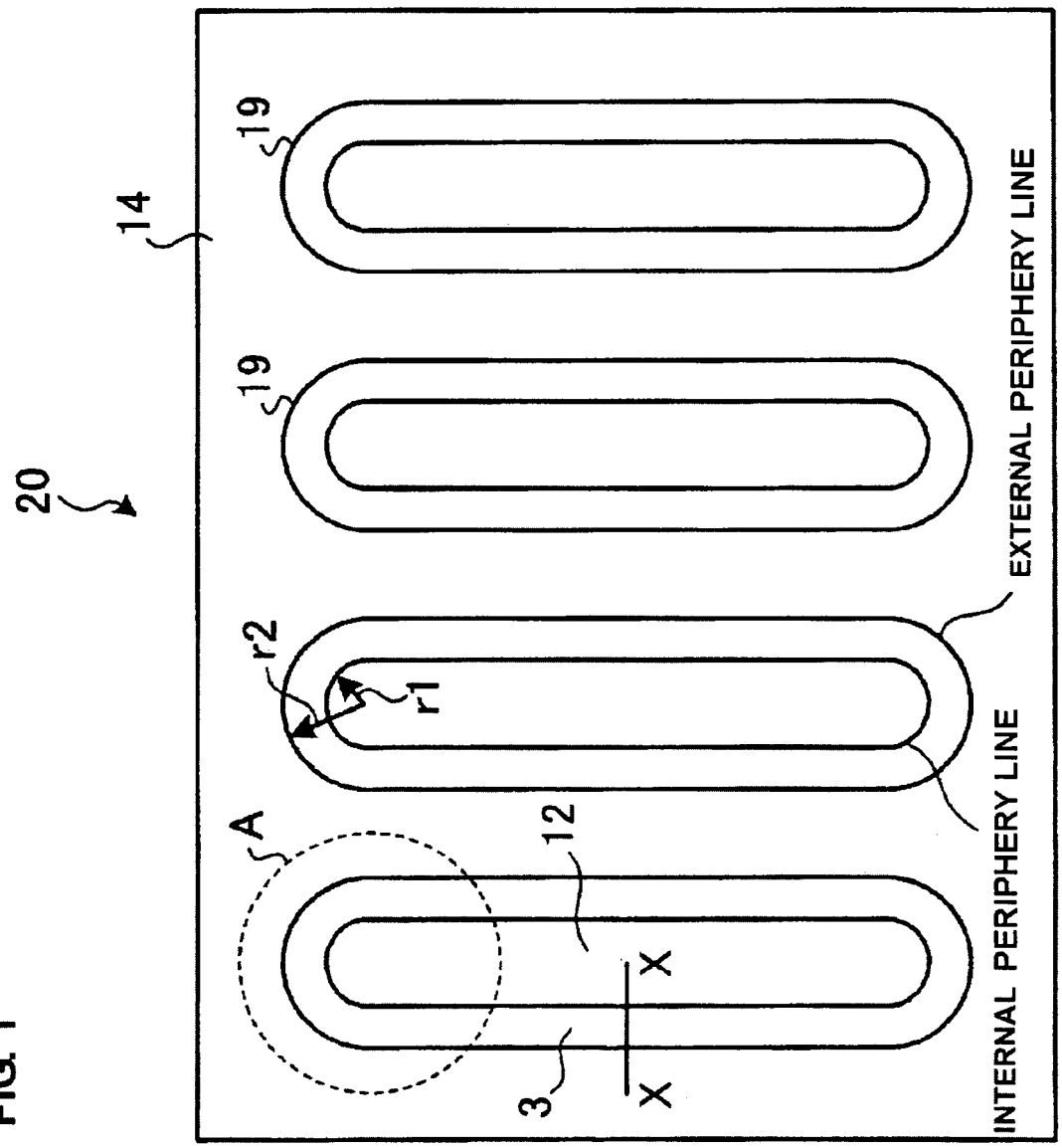
FIG. 1 is a plane view showing a principle part of a semiconductor device according to a first embodiment of the invention.

FIG. 1 is a plane view showing a semiconductor device according to a first embodiment of the invention. The semiconductor device is a bidirectional TLPM (trench lateral power MOSFET) 20. A cross sectional view along the line segment X-X in FIG. 1 is the same as FIG. 15. In addition, a method for manufacturing of the bidirectional TLPM20 is already explained with reference to FIG. 15 (discussed in the "Background of the Invention" section).

Figure 14:
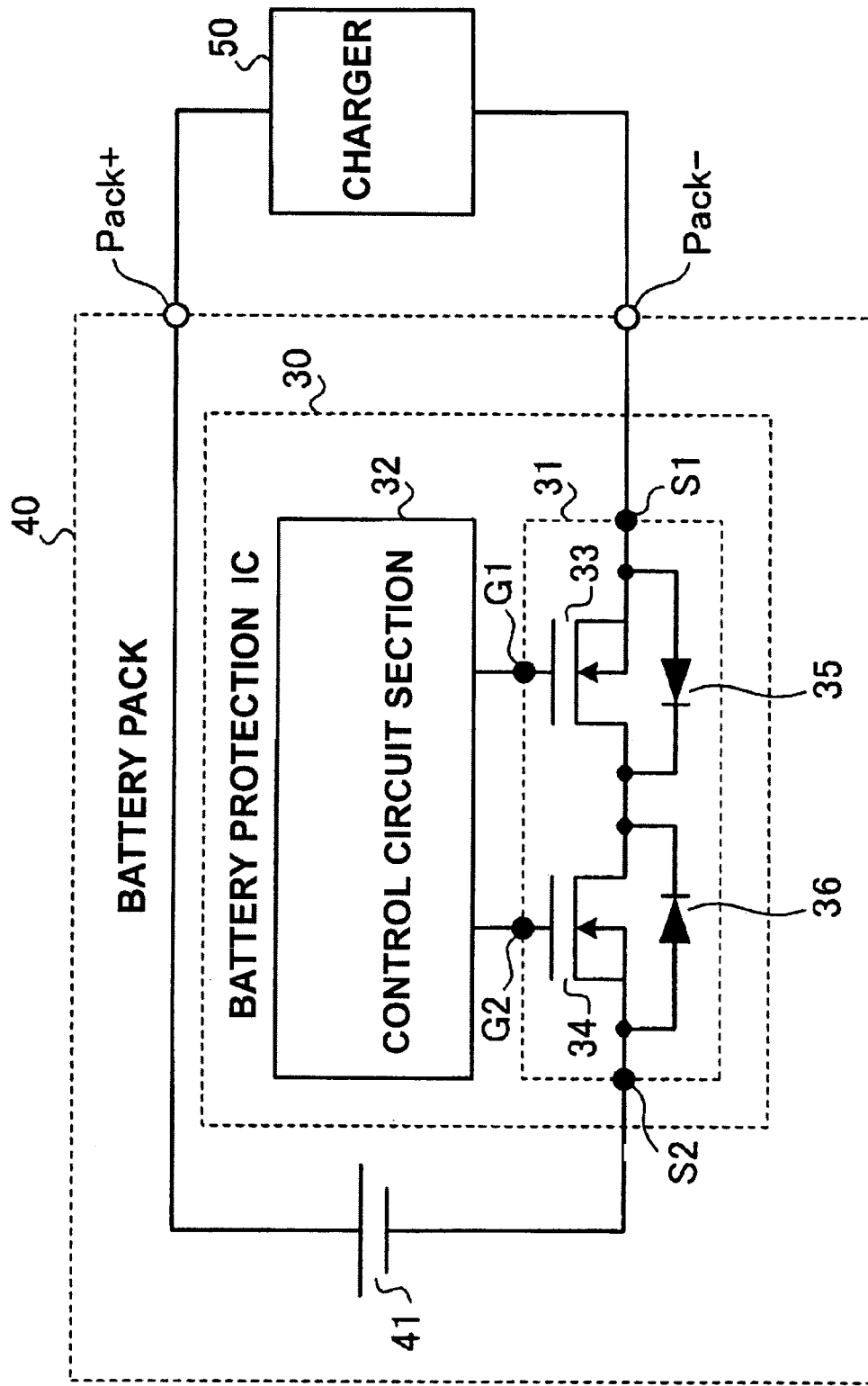
FIG. 14 is a block diagram showing a configuration of a battery pack.
Figure 17:
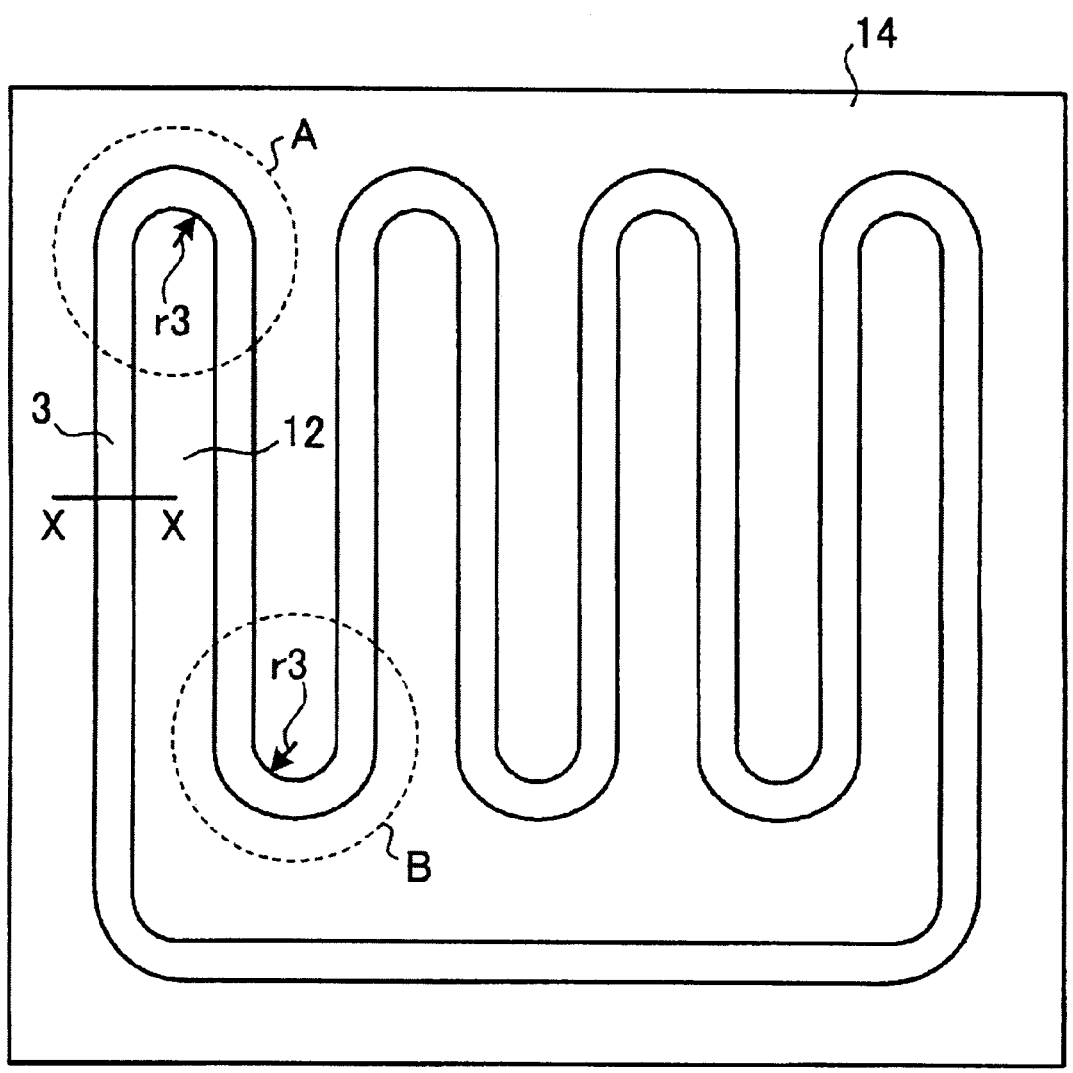
FIG. 17 is a plane view showing a principle part of a conventional bidirectional TLPM.

In addition, the configuration of the battery protection IC and the battery pack using the bidirectional TLPM 20 according to the first embodiment is the same as in the configuration shown in FIG. 14 (discussed in the "Background of the Invention" section). But the right nMOSFET 33 and the left nMOSFET 34 are to be exchanged respectively for a first nMOSFET 21 and a second nMOSFET 22 in the explanation of the first embodiment. By such a circumstance, explanations are omitted here about the cross sectional configuration of the bidirectional TLPM 20, the method for manufacturing of the bidirectional TLPM 20, and the configuration of the battery protection IC and the battery pack. In addition, in FIG. 1, the same symbol is indicated to the same element as shown in FIG. 17 (discussed in the "Background of the Invention" section).

As shown in FIG. 1, a plane pattern shape of a trench 3 is a closed curve shape. A first n source region 12 surrounded by a closed curve of the trench 3 is a straight line-shaped island having semi-circular portions in both ends, and a plurality of the islands are present. In the example shown in FIG. 1, four islands of the first n source regions 12 are present. The region of the outside of the islands of the first n source regions 12 is a second n source region 14. The second n source region 14 includes a plurality of semi-circular portions 19 surrounding the islands of the first n source regions 12.

In the plane pattern of the trench 3, when the potential of the second n source region 14 is higher than that of the first n source region 12 (in other words, when the potential of a second source electrode 17 becomes higher than that of a first source electrode 16) in the semi-circular portion in the section A of FIG. 1, an electric potential distribution concentrates from the second n source region 14 of the outside of the trench 3 toward the first n source region 12 of the inside of the trench 3. Therefore the electric field becomes stronger in the semi-circular portion than in the straight portions of the first n source region 12. Thus, the off breakdown voltage of the first nMOSFET 21 is determined in the section A.

Figure 16:
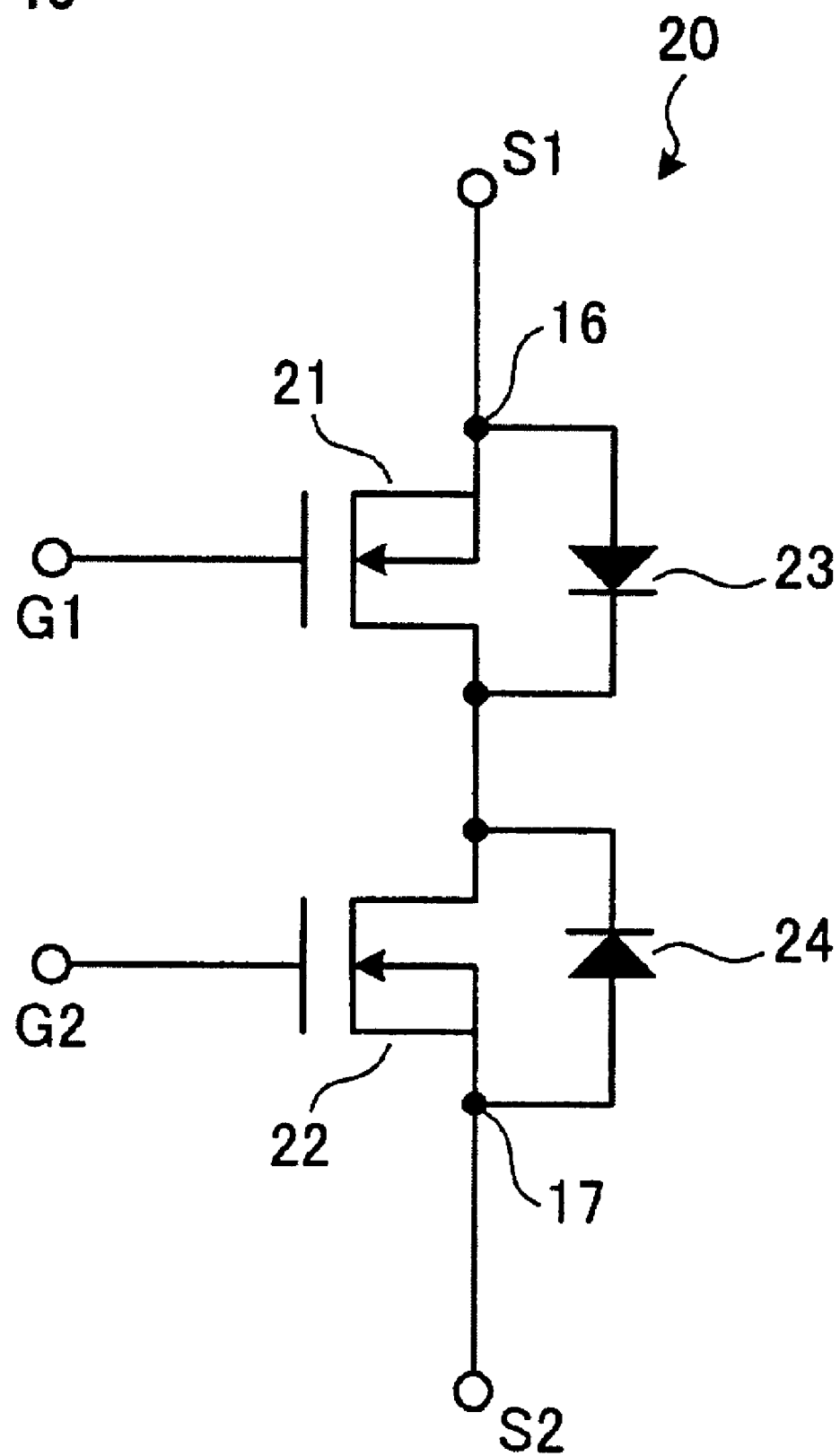
FIG. 16 is a circuit diagram showing an equivalent circuit of the bidirectional TLPM shown in FIG. 15.

On the other hand, when the potential of the first n source region 12 becomes higher than that of the second n source region 14, in the semi-circular portion in the section A, the electric potential distribution spreads from the first n source region 12 of the inside of the trench 3 toward the second n source region 14 of the outside of the trench 3. Therefore the electric field is relaxed more in the semi-circular portion than in the straight portions of the first n source region 12. Thus, in the section A, the off breakdown voltage of a second nMOSFET (corresponding to nMOSFET 22 in FIG. 16) is not determined.

Figure 15:
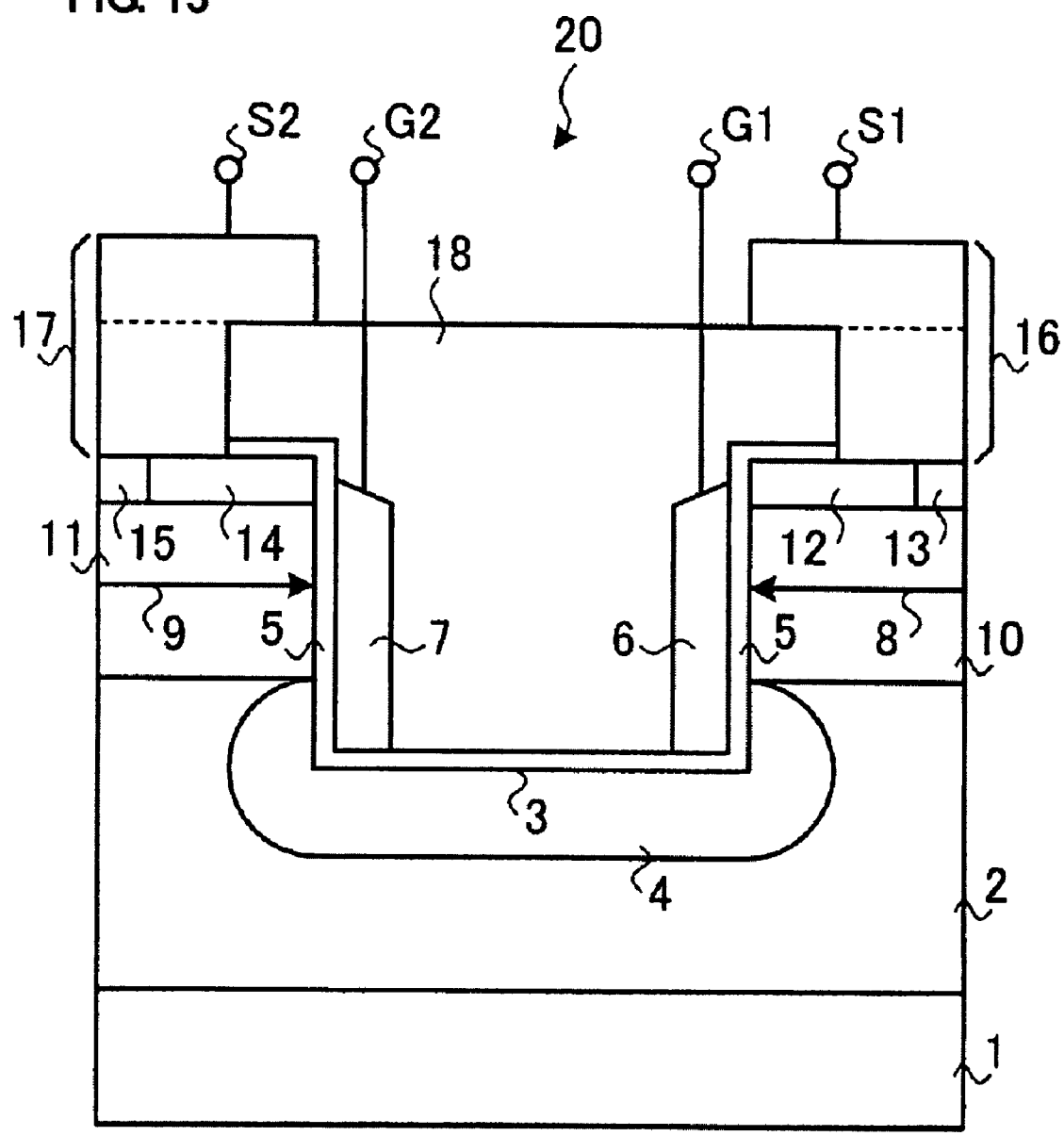
FIG. 15 is a cross sectional view showing a principle part of a bidirectional TLPM.

In the cross sectional configuration shown in FIG. 15, the conventional bidirectional TLPM 20 has the plane pattern shown in FIG. 17. Since the first gate electrode 6 formed on a first sidewall of the trench 3 and the second gate electrode 7 formed on a second sidewall opposite to the first sidewall of the trench 3 are separated electrically, a termination of the trench 3 is not present. Thus, since potential is distributed from the outside of the trench 3 toward the inside of the trench 3, the off breakdown voltages of the first nMOSFET 21 and the second nMOSFET 22 are respectively determined in each semi-circular portion of the section A and the section B in FIG. 17. Lowering of the off breakdown voltage can be avoided by making the curvature of the circular portion small. However, a device pitch becomes large when the curvature of the semi-circular portion becomes small. Therefore the area where a channel is formed decreases, and this causes an increase of on-resistance.

In comparison with the battery protection IC 30 shown in FIG. 14, where only the n MOSFET 33 of the minus side input-output terminal Pack− (the right side) of a battery pack 40 has a high breakdown voltage, the plane pattern shown in FIG. 1 is advantageous. The appropriate case for making the breakdown voltage of only nMOSFET 33 high means the case where a charger 50 cannot be connected to the battery pack 40 in reverse polarity in the system of the battery pack 40.

For example, the plane pattern is assumed to be the same plane pattern as shown in FIG. 1, and it is assumed that the width of the trench and the curvature (1/r1) of the semi-circular portions are respectively the same width of the trench and the same curvature (1/r3) of the semi-circular portions as shown in FIG. 17. In addition, it is assumed that at a straight-line portion in FIG. 1, the breakdown voltage of the first nMOSFET 21 and the second nMOSFET 22 are 26V together. Then the off breakdown voltage of the second nMOSFET 22 in the case that the first n source region 12 of the inside of the trench is made high potential becomes higher by around 2 V than that of the first nMOSFET 21 in the case that the second n source region 14 of the outside of the trench is made high potential.

In other words, it is possible for the off breakdown voltage of the second nMOSFET 22 to rise around 2 V in actual use without raising the on-resistance and without changing the manufacturing process. Here, r1 and r3 are respectively the radii of curvature of an internal circumference line in the semi-circular portions of the trench 3 in the plane patterns shown in FIG. 1 and FIG. 17.

In addition, the plane pattern is the same as the plane pattern as shown in FIG. 1, and the curvature (1/r1) of the semi-circular portion of trench 3 is made the same as the curvature (1/r3) of the plane pattern as shown in FIG. 17. And the width of the trench 3 of the plane pattern shown in FIG. 1 is made smaller (0.2 μm) than that of the trench 3 of the plane pattern shown in FIG. 17. In addition, it is assumed that at a straight-line portion in FIG. 1 the off breakdown voltage of the first nMOSFET 21 and that of the second nMOSFET 22 are 26V together. The radius r2 of the curvature of the external circumference line of the semi-circular portion of the trench 3 shrinks in 0.2 μm due to the width of the trench being small.

In this case, the off breakdown voltage of the second nMOSFET 22 can be made the same as the off breakdown voltage in the plane pattern shown in FIG. 17. On the other hand, the off breakdown voltage of the first nMOSFET 21 becomes smaller in around 2 V than the off breakdown voltage in the plane pattern shown in FIG. 17. In addition, because the pitch of a plurality of the first n source regions 12 can be narrowed by making the width of the trench narrow, the number of the first n source regions 12 can be increased. Thus, because the area forming channels can be increased, the on-resistance can be reduced.

In other words, the bidirectional TLPM 20 can be used as a battery protection electric switch of the battery protection IC 30 in actual use without changing the manufacturing process by narrowing the width of the trench, and the on-resistance can be reduced in comparison with that of the conventional semiconductor device. The off breakdown voltage of the first nMOSFET 21 can also be made smaller than that of the second nMOSFET 22 and the on-resistance of the bidirectional TLPM 20 can be lowered, in the plane pattern shown in FIG. 1. The curvature of the section A can be increased (in other words the radius r1 of the curvature of the section A is made small). Furthermore, the impurity concentration of a common n drain region 4 in the cross sectional configuration shown in FIG. 15 can be increased.

Second Embodiment

Figure 2:
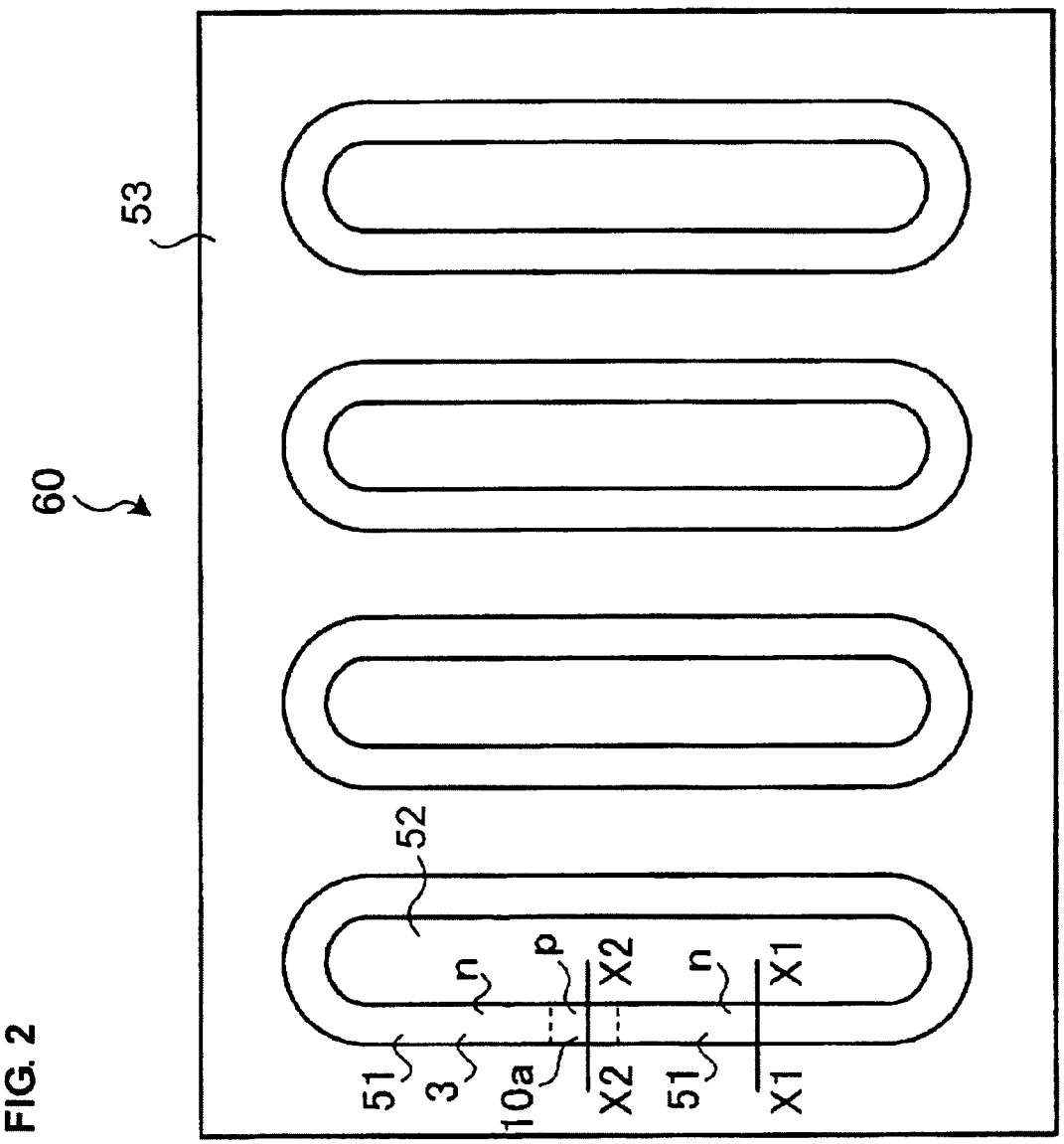
FIG. 2 is a plane view showing a principle part of a semiconductor device according to a second embodiment of the invention.
Figure 3:
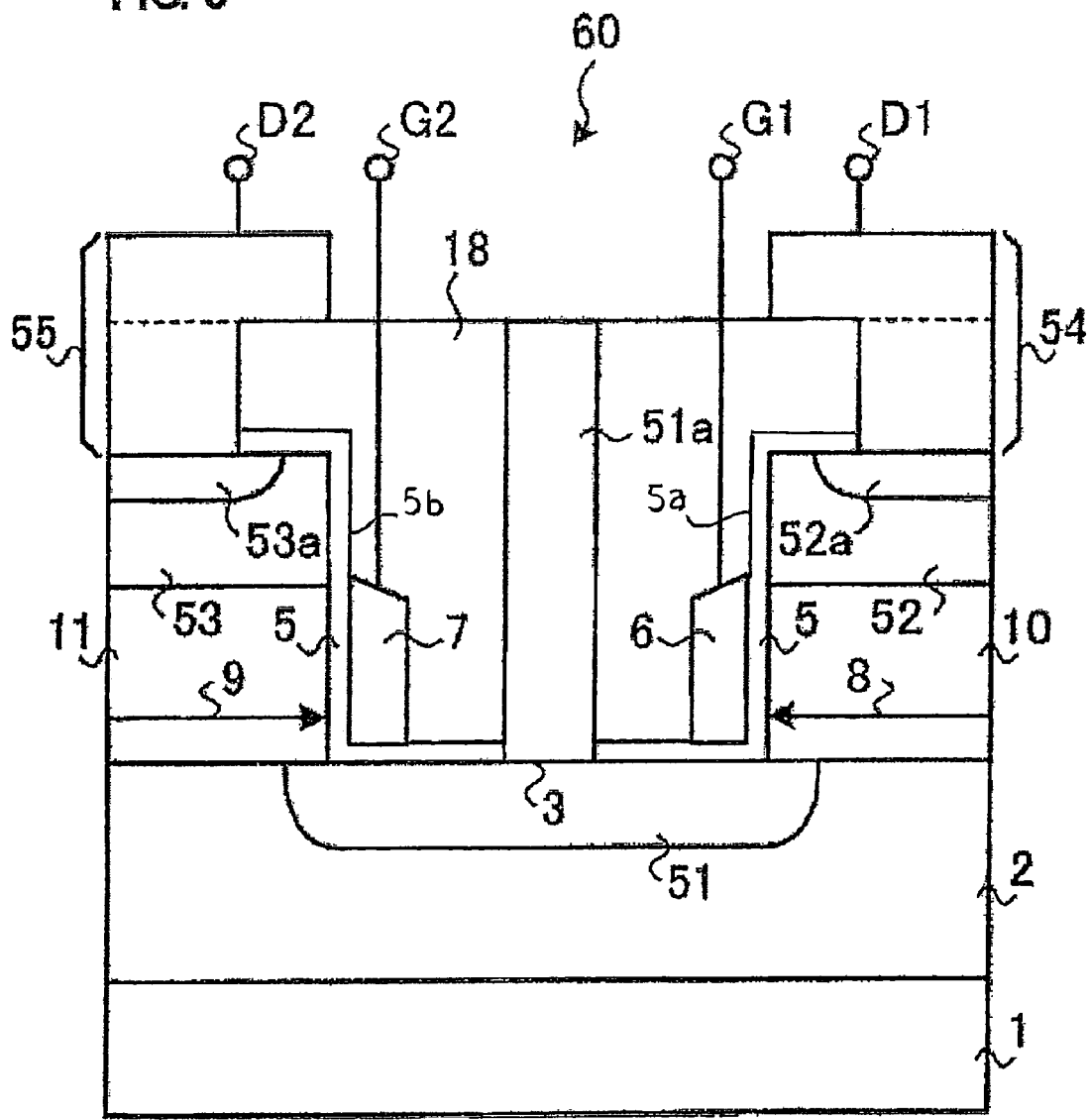
FIG. 3 is a cross sectional view along the line segment X1-X1 of FIG. 2.
Figure 4:
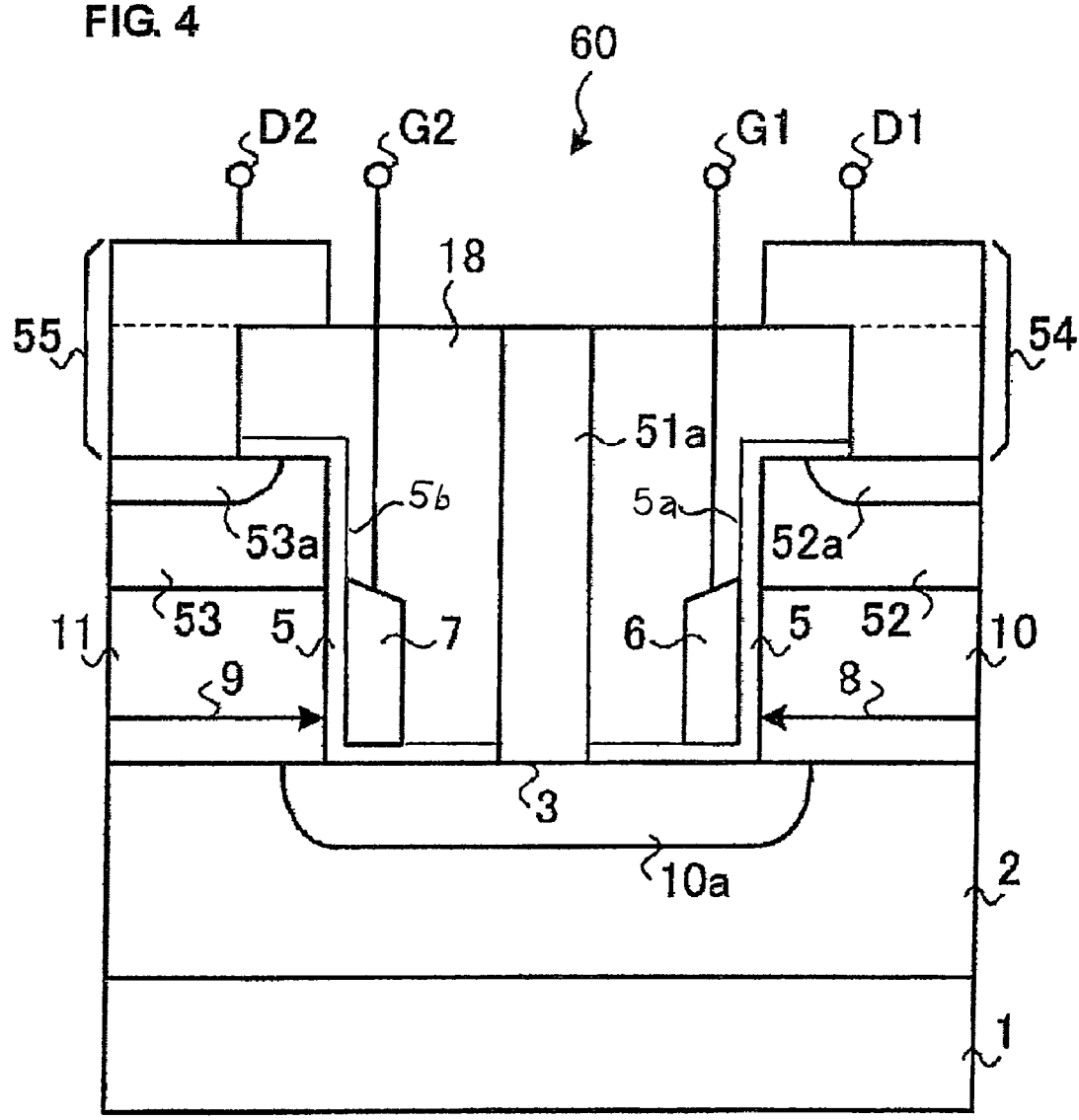
FIG. 4 is a cross sectional view along the line segment X2-X2 of FIG. 2.

FIG. 2 is a plane view showing a semiconductor device according to a second embodiment of the invention. FIGS. 3 and 4 are respectively cross sectional views along the line segment X1-X1 and the line segment X2-X2 of FIG. 2. As shown in FIGS. 3 and 4, the semiconductor device is a common source-type and input-output drain-type bidirectional TLPM 60.

As shown in FIG. 2, the first n source region 12 of FIG. 1 is exchanged for a first n drain region 52 and the second n source region 14 of FIG. 1 is exchanged for a second n drain region 53 in the bidirectional TLPM 60 according to the second embodiment. In addition, in the bottom of the trench 3, a common n source region 51 and a p base contact region 10a are formed selectively. In addition, in FIG. 2, only one location of a p base contact region 10a is shown, but the p base contact regions 10a are formed in a plurality of locations in an actual element. With reference to FIGS. 3 and 4, the method for manufacturing of the bidirectional TLPM 60 will now be explained.

At first, as shown in FIG. 3, an n well region 2 is formed on a p substrate 1 and the trench 3 is formed. A common n source region 51 is formed in the bottom of the trench 3, and a first gate electrode 6 and a second gate electrode 7 are formed on the sidewalls of the trench 3 at the same time on gate insulation film portions 5a and 5b. Subsequently a first p base region 10 and a second p base region 11 are formed respectively on a surface layer of a first n silicon pillar 8 and a surface layer of a second n silicon pillar 9 at the same time.

Subsequently a first n drain region 52 and the second n drain region 53 are formed respectively in a surface layer of the first p base region 10 and a surface layer of the second p base region 11 at the same time. After burying the trench 3 with an interlayer insulation film 18, the interlayer insulation film 18 is patterned, and a first drain contact region 52a and a second drain contact region 53a are formed respectively in a surface layer of the first drain region 52 and a surface layer of the second drain region 53 at the same time. Subsequently principal electrodes such as a source electrode 51a, a first drain electrode 54, and a second drain electrode 55 are formed.

As shown in FIG. 4, the p base contact region 10a connecting to both the first p base region 10 and the second p base region 11 are formed in an appropriate location in a depth direction of the trench 3. The p base contact region 10a is connected to the source electrode 51a. The source electrode 51a short-circuits the common n source region 51 and the p base contact region 10a, and is in a floating potential state without connecting to any other regions or locations. In addition, the first drain electrode 54 and the second drain electrode 55 are connected respectively to a first drain terminal D1 and a second drain terminal D2.

Figure 5:
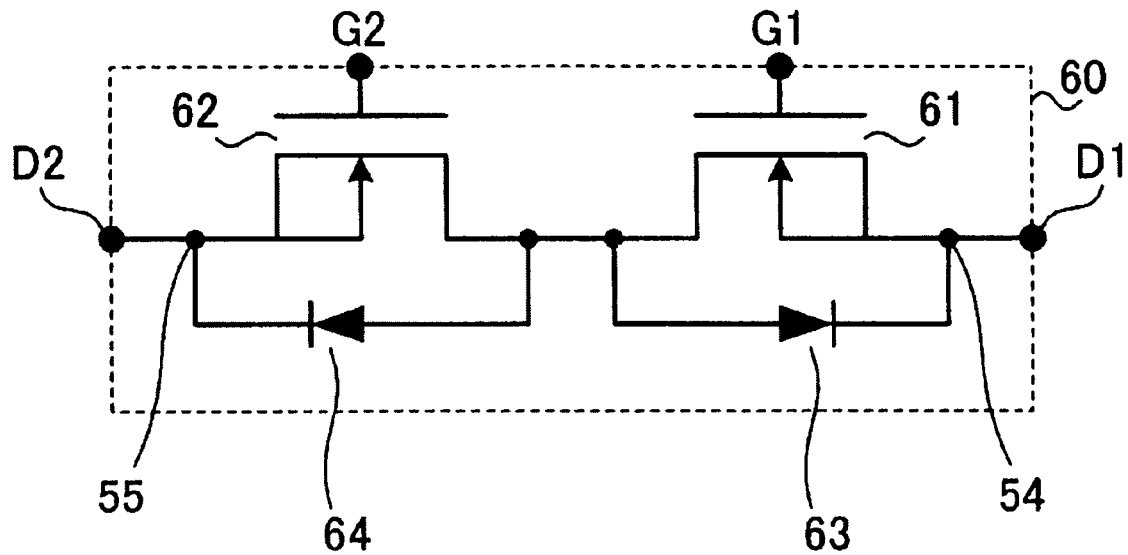
FIG. 5 is a circuit diagram showing an equivalent circuit of a bidirectional TLPM shown in FIGS. 3 and 4.

FIG. 5 is a circuit diagram showing an equivalent circuit of the bidirectional TLPM shown in FIGS. 3 and 4. As shown in FIG. 5, a first nMOSFET 61 comprises the n drain region 52, the first p base region 10 and the common n source region 51. A second nMOSFET 62 comprises the n drain region 53, the second p base region 11 and the common n source region 51. In addition, a first diode 63 connected in inverse parallel to the first nMOSFET 61 comprises the first drain region 52, the first p base region 10 and the p base contact region 10a. A second diode 64 connected in inverse parallel to the second nMOSFET 62 comprises the second drain region 53, the second p base region 11 and the p base contact region 10a.

When the bidirectional TLPM 60 of the configuration shown in FIG. 5 is applied as the bidirectional lateral power MOSFET 31 shown in FIG. 14, the second drain terminal D2 is connected to a minus side terminal of a battery 41, and the first drain terminal D1 is connected to a minus side input-output terminal Pack− of the battery pack 40. In this case, the off breakdown voltage of the first nMOSFET 61 in the case that the potential of the first drain terminal D1 is higher than that of the second drain terminal D2 can be made higher than that of the second nMOSFET 62 in the case that potential of the second drain terminal D2 is higher than that of the first drain terminal D1. Then, in the bidirectional TLPM 60 of the configuration shown in FIGS. 3 through 5, the same advantageous effect as the first embodiment can be obtained when the plane pattern shown in FIG. 2 is used.

In addition, in the first embodiment and the second embodiment, the first conductivity type and the second conductivity type are taken respectively as the n type and the p type. The invention, however, is similarly valid even when the first conductivity type and the second conductivity type are taken respectively as the p type and the n type. But in the case that the conductivity type is reversed, it is necessary to exchange the location of the first source region 12 for that of the second source region 14, and to exchange the location of the first n drain region 52 for that of the second n drain region 53 in the plane pattern corresponding to FIG. 1 and FIG. 2. In addition, it is not rare that the bidirectional TLPM 20 or the bidirectional TLPM 60 is formed along with an integrated circuit such as a control circuit in the same semiconductor substrate.

In addition, although the first embodiment and the second embodiment have been explained only for the case that the bidirectional lateral power MOSFET 31 is configured respectively by the bidirectional TLPMs 20 and 60, the battery protection electric switch is not limited to the bidirectional TLPMs 20 and 60. For example, two MOSFETs of the bidirectional lateral power MOSFET 31 can be replaced by other elements. For example, a planar gate MOSFET can be used, and also a trench gate MOSFET can be used. When two MOSFETs of the bidirectional lateral power MOSFET 31 are replaced by other elements, elements with the desired off breakdown voltages can be attained.

In addition, a semiconductor device for use as a battery protection electric switch is not limited to (1) a device in which the sources of two nMOSFETs are common as shown in FIG. 5 or (2) a device in which the drains of two nMOSFETs are common as shown in FIG. 14. For example, a semiconductor device for use in a battery protection electric switch can be such that (3) the sources of two pMOSFETs are common, such that (4) drains of two pMOSFETs are common, such that (5) a source of a pMOSFET (the first transistor) and a drain of an nMOSFET (the second transistor) are common, or such that (6) a drain of an nMOSFET (the first transistor) and a source of a pMOSFET (the second transistor) are common.

The relationship of being large or small among the breakdown voltages of the first transistor and the second transistor, the voltage of the power supply, and the minimum and maximum voltages of the battery will now be explained with regard to the semiconductor devices (1) through (6), including semiconductor devices according to the first embodiment and the second embodiment. In the following explanation, the voltage of the power supply is expressed as V0, and the maximum voltage and the minimum voltage of the battery are respectively as V1max and V1min. In this regard, the expression 0<V1min<V1max<V0 applies.

Third Embodiment

Figure 6:
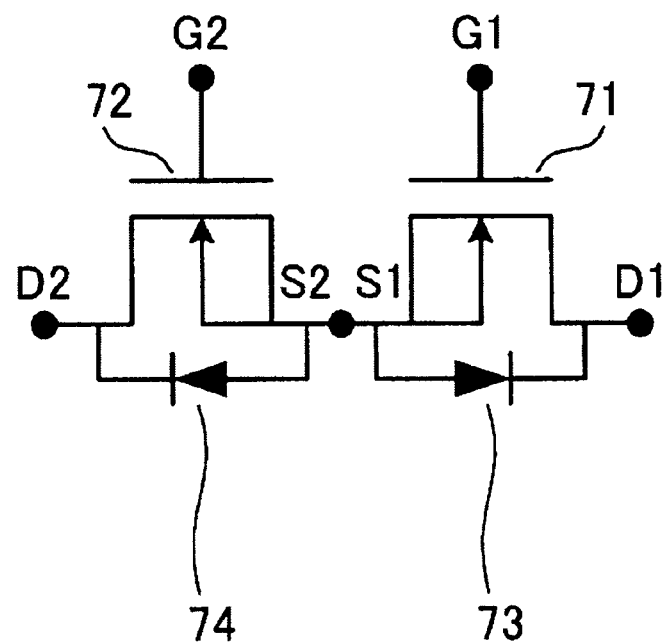
FIG. 6 is a circuit diagram showing an equivalent circuit of a semiconductor device according to a third embodiment of the invention.

FIG. 6 is a circuit diagram showing an equivalent circuit of the semiconductor device according to the third embodiment. The third embodiment corresponds to the above semiconductor device (1). In other words, a first source terminal S1 of a first nMOSFET 71 is connected to a second source terminal S2 of the second nMOSFET 72. In addition, an anode and a cathode of a first diode 73 are connected respectively to the first source terminal S1 and the first drain terminal D1 of the first nMOSFET 71, and an anode and a cathode of a second diode 74 are connected respectively to the second source terminal S2 and the second drain terminal D2 of the second nMOSFET 72.

Figure 7:
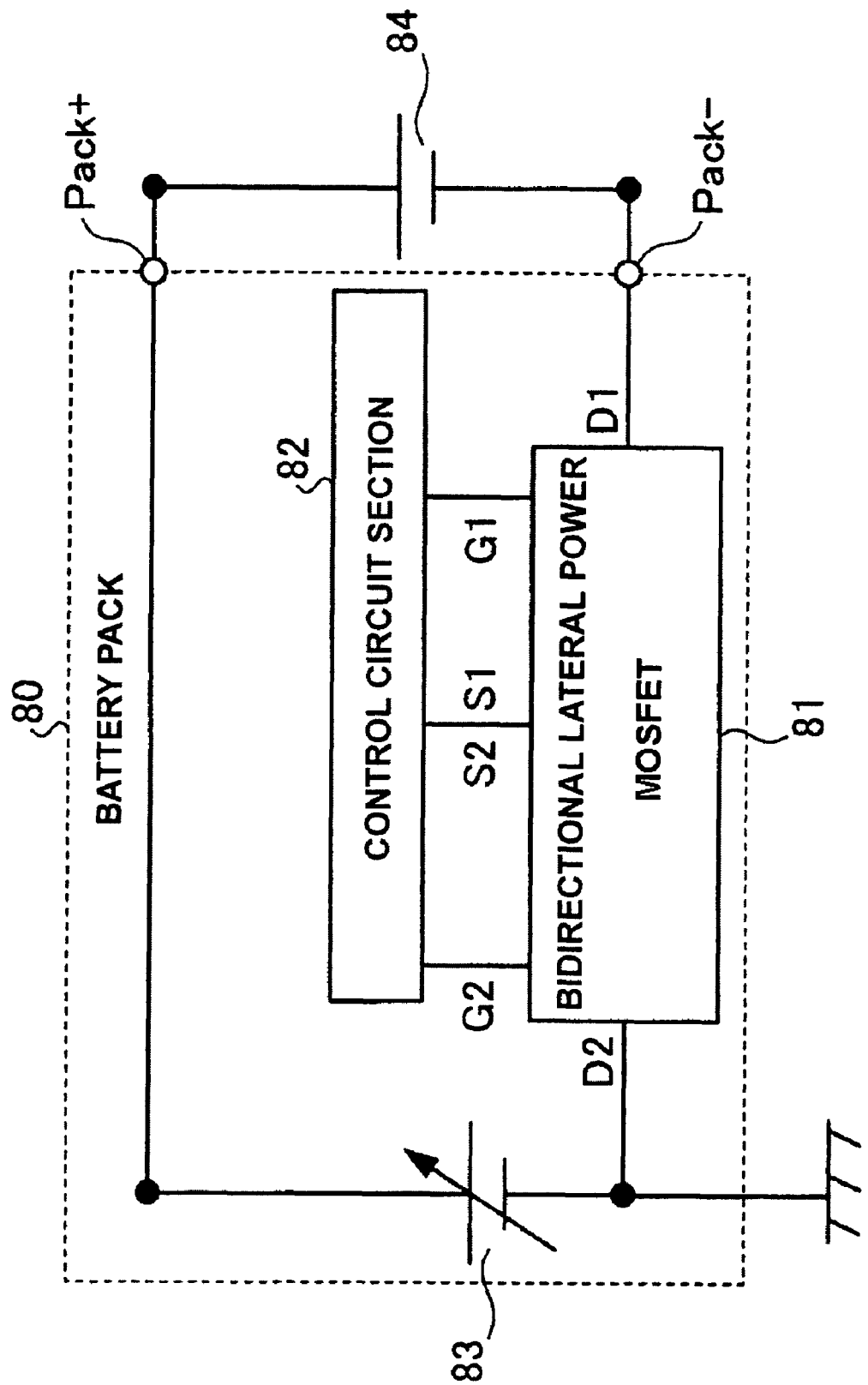
FIG. 7 is a schematic diagram showing a battery pack that is connected in proper polarity to a power supply, the battery pack having a semiconductor device according to the third embodiment of the invention.
Figure 8:
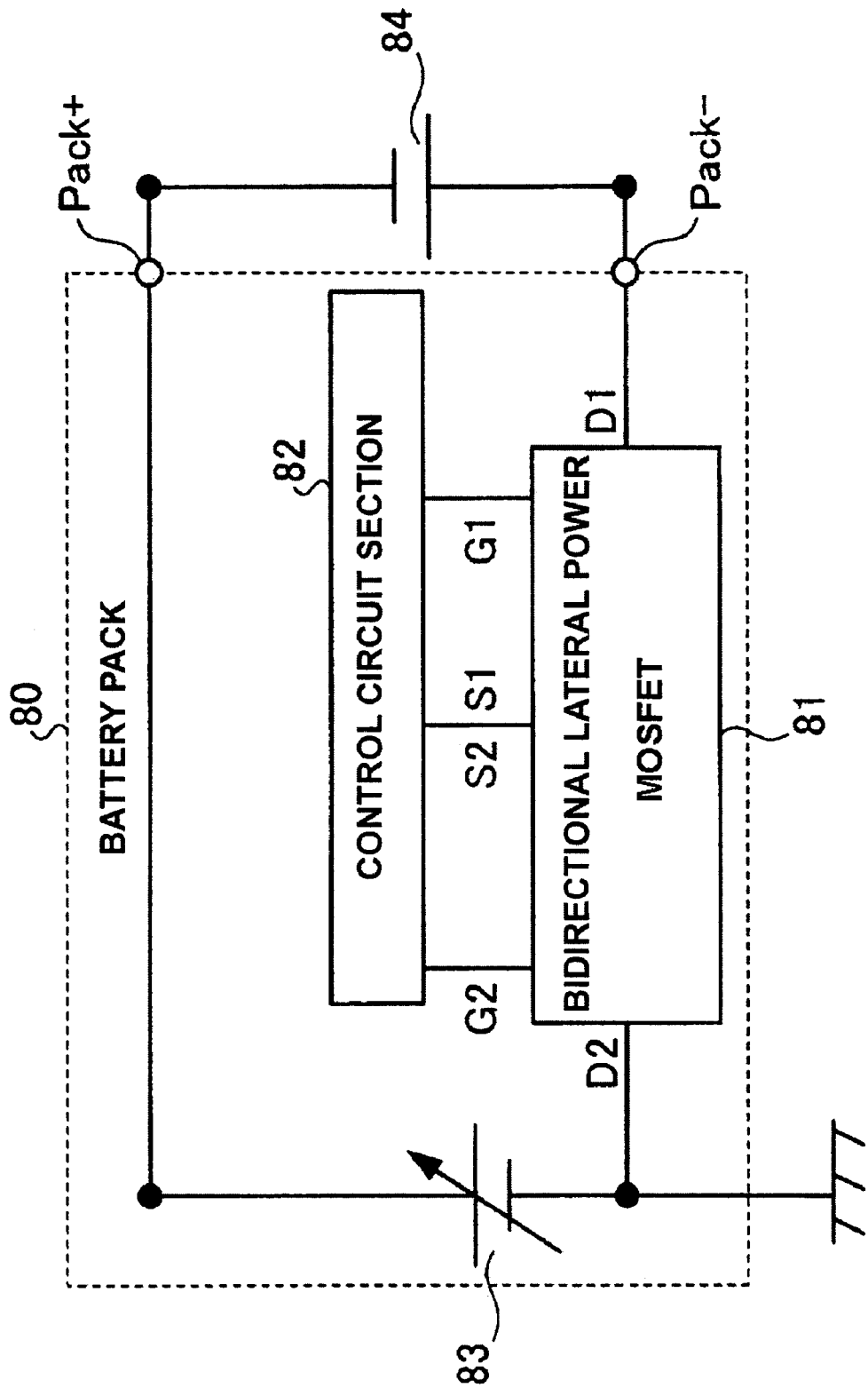
FIG. 8 is a schematic diagram showing a battery pack that is connected in reverse polarity to a power supply, the battery pack having a semiconductor device according to the third embodiment of the invention.

FIG. 7 is a schematic diagram showing the battery pack with the power supply connected in proper polarity to the semiconductor device according to the third embodiment. FIG. 8 is a schematic diagram showing the battery pack with the power supply connected in reverse polarity to the semiconductor device according to the third embodiment. Reference numerals 80, 81, 82, 83 and 84 indicate respectively the battery pack, the bidirectional lateral power MOSFET, the control circuit, the battery and the power supply in FIGS. 7 and 8.

A bidirectional lateral power MOSFET 81 is the semiconductor device of the configuration shown in FIG. 6. The first gate terminal G1 of the first nMOSFET 71 and the second gate terminal G2 of the second nMOSFET 72 are connected to a control circuit section 82. The first source terminal S1 of the first nMOSFET 71 and the second source terminal S2 of the second nMOSFET 72 are connected commonly to the control circuit section 82. The first drain terminal D1 of the first nMOSFET 71 is connected to the minus side input-output terminal Pack– of the battery pack 80.

The second drain terminal D2 of the second nMOSFET 72 is connected to the minus side terminal of the battery 83. The control circuit section 82 is connected to the plus side input-output terminal Pack+ of the battery pack 80 through a resistor which is not illustrated. In addition, the control circuit section 82 is connected to the minus side input-output terminal Pack– through a resistor which is not illustrated.

When the power supply 84 is connected in proper polarity as shown in FIG. 7, the potential of the second drain terminal D2 becomes higher than that of the first drain terminal D1, and a voltage of –(V0–V1min) is applied between D1 and D2 at the maximum. In this case, it is only necessary to intercept a voltage of –(V0–V1min) due to make the second nMOSFET 72 enter an off state by short-circuiting between the second gate terminal G2 and the second source terminal S2 to protect the battery 83 in safety.

To do so, it is necessary to satisfy the next expression (1) when the breakdown voltage of the second nMOSFET 72 is expressed as BVds2. In this regard, the expression BVds2>0 applies.

$$BVds2 \geq V0 - V1min \quad (1)$$

On the other hand, when the power supply 84 is connected in reverse polarity as shown in FIG. 8, the potential of the first drain terminal D1 becomes higher than that of the second drain terminal D2, and a voltage of V0+V1max is applied between D1 and D2 at the maximum. In other words, a voltage of V0+V1max is applied between D1 and S1 of the first nMOSFET71 at the maximum. In this case, it is only necessary to intercept a voltage of V0+V1max due to make the first nMOSFET 71 enter the off state by short-circuiting between the first gate terminal G1 and the first source terminal S1 to protect the battery 83 safely.

To do so, it is necessary to satisfy the next expression (2) when the breakdown voltage of the first nMOSFET 71 is expressed as BVds1. In this regard, the expression BVds1>0 applies. In addition, the expression (3) is introduced by the expression (1) and the expression (2) as the relationship between BVds1 and BVds2.

$$BVds1 \geq V0 + V1max \quad (2)$$

$$0 < BVds2 < BVds1 \quad (3)$$

Fourth Embodiment

Figure 9:
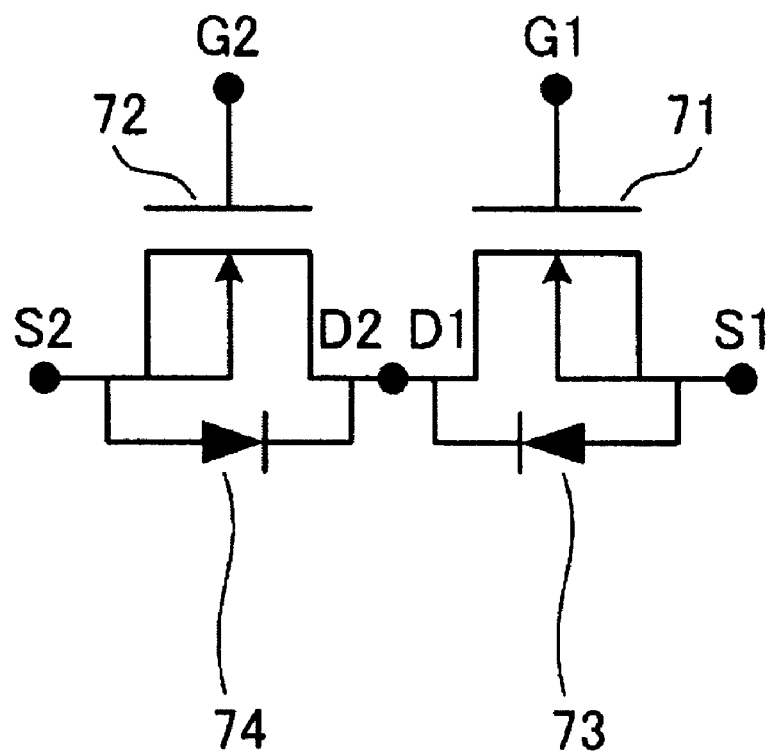
FIG. 9 is a circuit diagram showing an equivalent circuit of a semiconductor device according to the fourth embodiment of the invention.

FIG. 9 is a circuit diagram showing an equivalent circuit of a semiconductor device according to the fourth embodiment. The fourth embodiment corresponds to the above semiconductor device (2). In other words, the first drain terminal D1 of the first nMOSFET 71 is connected to the second drain terminal D2 of the second nMOSFET 72.

In the battery pack including the semiconductor device according to the fourth embodiment, the first drain terminal D1 of the first nMOSFET 71 and the second drain terminal D2 of the second nMOSFET 72 are connected commonly to the control circuit section. In addition, the first source terminal S1 of the first nMOSFET71 is connected to the minus side input-output terminal of the battery pack. The second source terminal S2 of the second nMOSFET 72 is connected to the minus side terminal of the battery. In other words, in FIG. 7 or 8, D1 and S1 are to be exchanged, and D2 and S2 are to be exchanged.

When the power supply is connected in proper polarity, the potential of the second source terminal S2 becomes higher than that of the first source terminal S1, and a voltage of –(V0–V1min) is applied between S1 and S2 at the maximum. In other words, a voltage of V0–V1min is applied between D1 and S1 of the first nMOSFET 71 at the maximum. In this case, it is only necessary to intercept a voltage of –(V0–V1min) due to make the first nMOSFET 71 enter the off state by short-circuiting between the first gate terminal G1 and the first source terminal S1 to protect the battery safely.

To do so, it is necessary for the breakdown voltage BVds1 of the first nMOSFET 71 to satisfy the next expression (4).

$$BVds1 \geq V0 - V1min \quad (4)$$

On the other hand, when the power supply is connected in reverse polarity, the potential of the first source terminal S1 becomes higher than that of the second source terminal S2, and a voltage of V0+V1max is applied between S1 and S2 at the maximum. In other words, a voltage of V0+V1max is applied between D2 and S2 of the second nMOSFET 72 at the maximum. In this case, it is only necessary to intercept a voltage of V0+V1max due to make the second nMOSFET 72 enter the off state by short-circuiting between the second gate terminal G2 and the second source terminal S2 to protect the battery safely.

To do so, it is necessary for the breakdown voltage BVds2 of the second nMOSFET 72 to satisfy the next expression (5). In addition, the expression (6) is introduced by the expression (4) and the expression (5) as the relationship between BVds1 and BVds2.

$$BVds2 \geq V0+V1\max \quad (5)$$

$$0 < BVds1 < BVds2 \quad (6)$$

Fifth Embodiment

Figure 10:
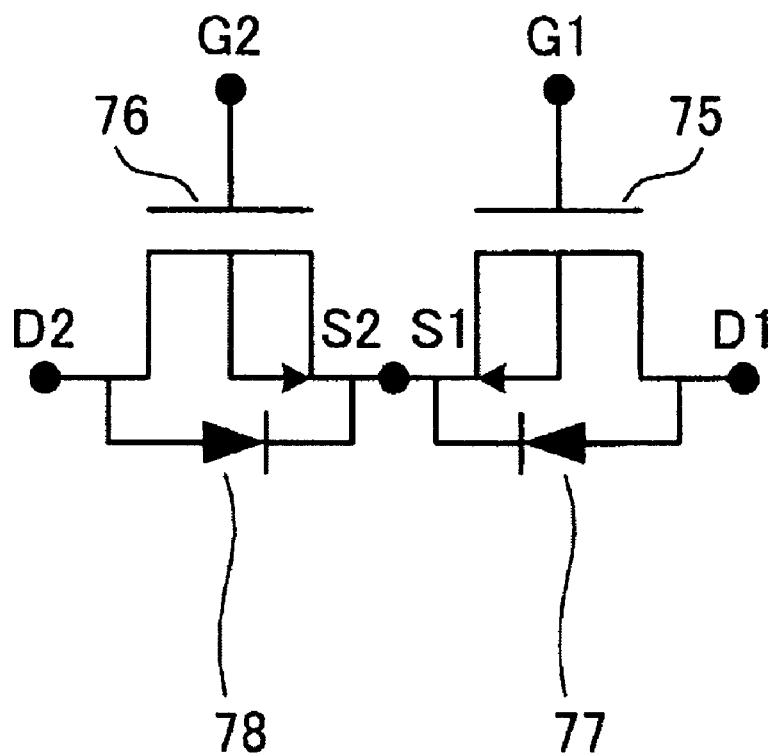
FIG. 10 is a circuit diagram showing an equivalent circuit of a semiconductor device according to the fifth embodiment of the invention.

FIG. 10 is a circuit diagram showing an equivalent circuit of a semiconductor device according to the fifth embodiment. The fifth embodiment corresponds to the above semiconductor device (3). In other words, a first source terminal S1 of a first pMOSFET 75 is connected to a second source terminal S2 of a second pMOSFET 76. In addition, an anode and a cathode of a first diode 77 are connected respectively to the first drain terminal D1 and the first source terminal S1 of the first pMOSFET 75. An anode and a cathode of a second diode 78 are connected respectively to the second drain terminal D2 and the second source terminal S2 of the second pMOSFET 76.

In the battery pack including the semiconductor device according to the fifth embodiment, the first source terminal S1 of the first pMOSFET 75 and the second source terminal S2 of the second pMOSFET 76 are connected commonly to the control circuit section. In addition, the first drain terminal D1 of the first pMOSFET 75 is connected to the minus side input-output terminal of the battery pack. The second drain terminal D2 of the second pMOSFET 76 is connected to the minus side terminal of the battery. In other words, the circuit block connection in the battery pack including the semiconductor device according to the fifth embodiment becomes the same as FIG. 7 or 8.

When the power supply is connected in proper polarity, the potential of the second drain terminal D2 becomes higher than that of the first drain terminal D1, and a voltage of −(V0−V1min) is applied between D1 and D2 at the maximum. In other words, a voltage of −(V0−V1min) is applied between D1 and S1 of the first pMOSFET 75 at the maximum. In this case, it is only necessary to intercept a voltage of −(V0−V1min) due to make the first pMOSFET 75 enter the off state by short-circuiting between the first gate terminal G1 and the first source terminal S1 to protect the battery safely.

To do so, it is necessary for the breakdown voltage −BVds1 of the first pMOSFET 75 to satisfy the next expression (7).

$$BVds1 \geq V0-V1\min \quad (7)$$

On the other hand, when the power supply is connected in reverse polarity, potential the first drain terminal D1 becomes higher than that of the second drain terminal D2, and voltage of V0+V1max is applied between D1 and D2 at the maximum. In other words, a voltage of −(V0+V1max) is applied between D2 and S2 of the second pMOSFET 76 at the maximum. In this case, it is only necessary to intercept a voltage of V0+V1max due to make the second pMOSFET 76 enter the off state by short-circuiting between the second gate terminal G2 and the second source terminal S2 to protect the battery safely.

To do so, it is necessary for the breakdown voltage −BVds2 of the second pMOSFET 76 to satisfy the next expression (8). In addition, the expression (9) is introduced by the expression (7) and the expression (8) as the relationship (9) between BVds1 and BVds2.

$$BVds2 \geq V0+V1\max \quad (8)$$

$$0 < BVds1 < BVds2 \quad (9)$$

Sixth Embodiment

Figure 11:
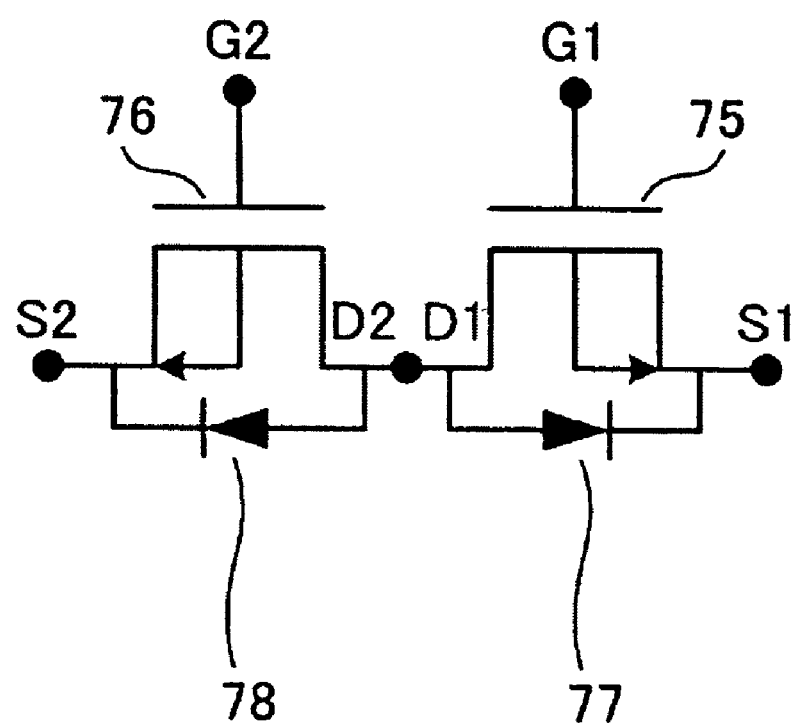
FIG. 11 is a circuit diagram showing an equivalent circuit of a semiconductor device according to the sixth embodiment of the invention.

FIG. 11 is a circuit diagram showing an equivalent circuit of a semiconductor device according to the sixth embodiment. The sixth embodiment corresponds to the above semiconductor device (4). In other words, the first drain terminal D1 of the first pMOSFET 75 is connected to the second drain terminal D2 of the second pMOSFET 76.

In the battery pack including the semiconductor device according to the sixth embodiment, the first drain terminal D1 of the first pMOSFET 75 and the second drain terminal D2 of the second pMOSFET 76 are connected commonly to the control circuit section. In addition, the first source terminal S1 of the first pMOSFET 75 is connected to the minus side input-output terminal of the battery pack. The second source terminal S2 of the second pMOSFET 76 is connected to the minus side terminal of the battery. In other words, D1 and S1 are to be exchanged, and D2 and S2 are to be exchanged in FIG. 7 or FIG. 8.

When the power supply is connected in proper polarity, the potential of the second source terminal S2 becomes higher than that of the first source terminal S1, and a voltage of −(V0−V1min) is applied between S1 and S2 at the maximum. In other words, a voltage of −(V0−V1min) is applied between D2 and S2 of the second pMOSFET76 at the maximum. In this case, it is only necessary to intercept a voltage of −(V0−V1min) due to make the second pMOSFET 76 enter the off state by short-circuiting between the second gate terminal G2 and the second source terminal S2 to protect the battery safely.

To do so, it is necessary for the breakdown voltage −BVds2 of the second pMOSFET76 to satisfy the next expression (10).

$$BVds2 \geq V0-V1\min \quad (10)$$

On the other hand, when the power supply is connected in reverse polarity, the potential of the first source terminal S1 becomes higher than that of the second source terminal S2, and a voltage of V0+V1max is applied between S1 and S2 at the maximum. In other words, a voltage of −(V0+V1max) is applied between D1 and S1 of the first pMOSFET 75 at the maximum. In this case, it is only necessary to intercept a voltage of V0+V1max due to make the first pMOSFET 75 enter the off state by short-circuiting between the first gate terminal G1 and the first source terminal S1 to protect the battery safely.

To do so, it is necessary for the breakdown voltage −BVds1 of the first pMOSFET 75 to satisfy the next expression (11). In addition, the expression (12) is introduced by the expression (10) and the expression (11) as the relationship between BVds1 and BVds2.

$$BVds1 \geq V0+V1\max \quad (11)$$

$$0 < BVds2 < BVds1 \quad (12)$$

Seventh Embodiment

Figure 12:
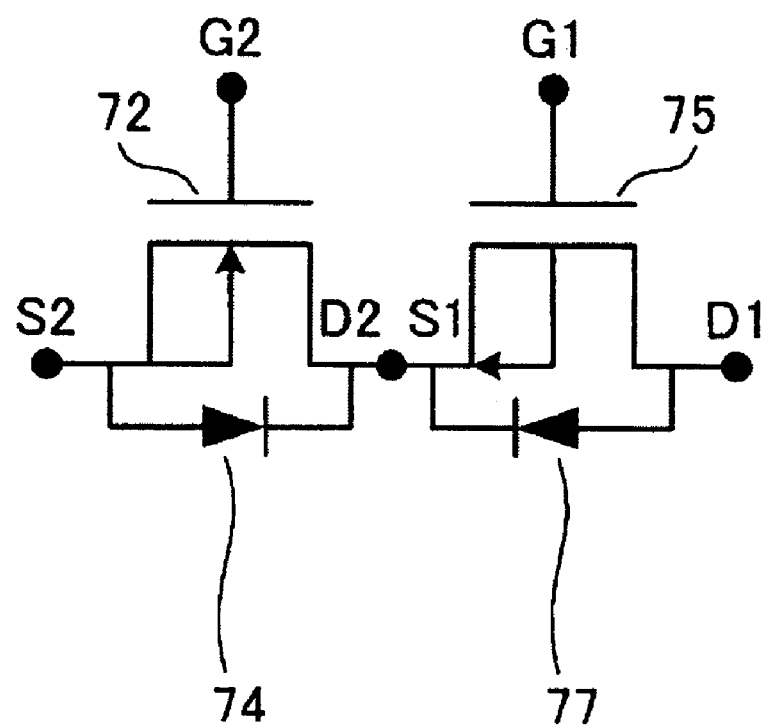
FIG. 12 is a circuit diagram showing an equivalent circuit of a semiconductor device according to the seventh embodiment of the invention.

FIG. 12 is a circuit diagram showing an equivalent circuit of a semiconductor device according to the seventh embodiment. The seventh embodiment corresponds to the above semiconductor device (5). In other words, the first source terminal S1 of the first pMOSFET 75 is connected to the second drain terminal D2 of the second nMOSFET 72.

In the battery pack including the semiconductor device according to the seventh embodiment, the first source terminal S1 of the first pMOSFET 75 and the second drain terminal D2 of the second nMOSFET 72 are connected commonly to the control circuit section. In addition, the first drain terminal D1 of the first pMOSFET 75 is connected to the minus side input-output terminal of the battery pack. The second source terminal S2 of the second nMOSFET 72 is connected to the minus side terminal of the battery. In other words, D2 and S2 are to be exchanged in FIG. 7 or FIG. 8.

When the power supply is connected in proper polarity, the potential of the second source terminal S2 becomes higher than that of the first drain terminal D1, and voltage of $-(V0-V1\min)$ is applied between D1 and S2 at the maximum. In other words, a voltage of $-(V0-V1\min)$ is applied between D1 and S1 of the first pMOSFET 75 at the maximum. In this case, it is only necessary to intercept a voltage of $-(V0-V1\min)$ due to make the first pMOSFET 75 enter the off state by short-circuiting between the first gate terminal G1 and the first source terminal S1 to protect the battery safely.

To do so, it is necessary for the breakdown voltage $-BVds1$ of the first pMOSFET 75 to satisfy the next expression (13).

$$BVds1 \geq V0 - V1\min \tag{13}$$

On the other hand, when the power supply is connected in reverse polarity, the potential of the first drain terminal D1 becomes higher than that of the second source terminal S2, and a voltage of $V0+V1\max$ is applied between D1 and S2 at the maximum. In other words, a voltage of $V0+V1\max$ is applied between D2 and S2 of the second nMOSFET 72 at the maximum. In this case, it is only necessary to intercept a voltage of $V0+V1\max$ due to make the second nMOSFET 72 enter the off state by short-circuiting between the second gate terminal G2 and the second source terminal S2 to protect the battery safely.

To do so, it is necessary for the breakdown voltage $BVds2$ of the second nMOSFET 72 to satisfy the next expression (14). In addition, the expression (15) is introduced by the expression (13) and the expression (14) as the relationship between BVds1 and BVds2.

$$BVds2 \geq V0 + V1\max \tag{14}$$

$$0 < BVds1 < BVds2 \tag{15}$$

Eighth Embodiment

Figure 13:
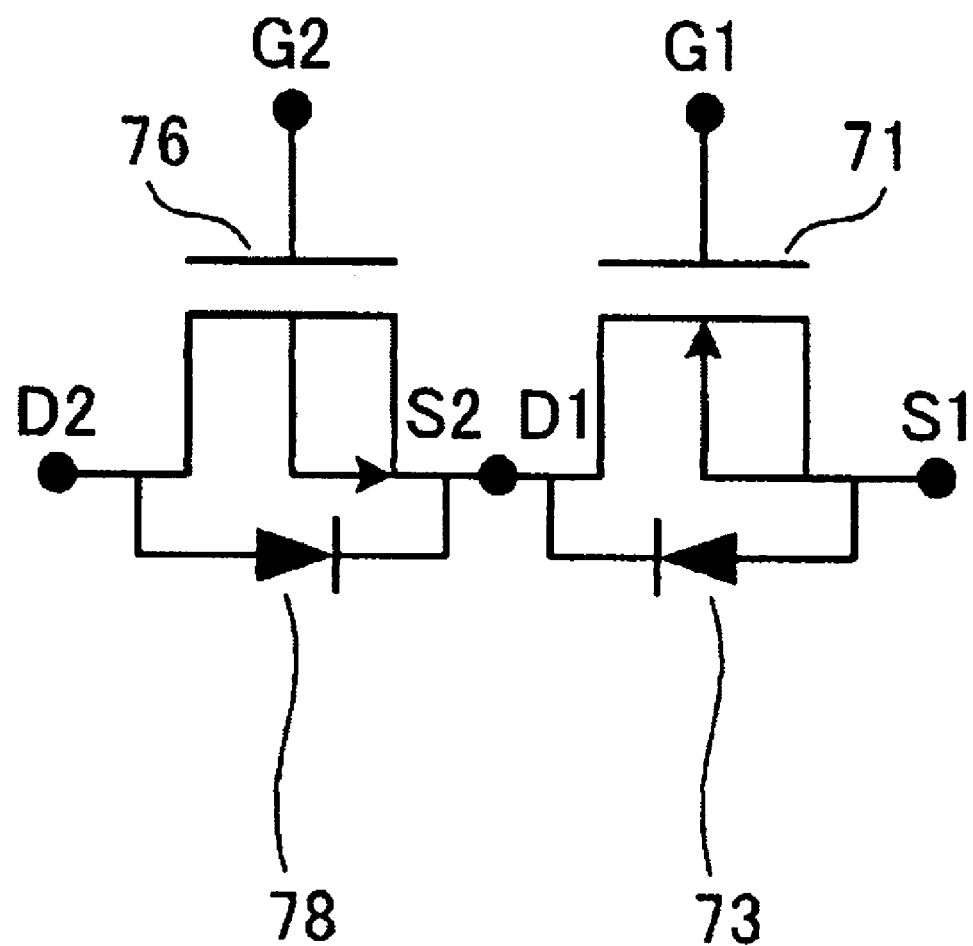
FIG. 13 is a circuit diagram showing an equivalent circuit of a semiconductor device according to the eighth embodiment of the invention.

FIG. 13 is a circuit diagram showing an equivalent circuit of a semiconductor device according to the eighth embodiment. The eighth embodiment corresponds to the above semiconductor device (6). In other words, the first drain terminal D1 of the first nMOSFET 71 is connected to the second source terminal S2 of the second pMOSFET 76.

In the battery pack including the semiconductor device according to the eighth embodiment, the first drain terminal D1 of the first nMOSFET 71 and the second source terminal S2 of the second pMOSFET 76 are connected commonly to the control circuit section. In addition, the first source terminal S1 of the first nMOSFET 71 is connected to the minus side input-output terminal of the battery pack. The second drain terminal D2 of the second pMOSFET 76 is connected to the minus side terminal of the battery. In other words, D1 and S1 are to be exchanged in FIG. 7 or FIG. 8.

When the power supply is connected in proper polarity, the potential of the second drain terminal D2 becomes higher than that of the first source terminal S1, and a voltage of $-(V0-V1\min)$ is applied between S1 and D2 at the maximum. In other words, a voltage of $V0-V1\min$ is applied between D1 and S1 of the first nMOSFET71 at the maximum. In this case, it is only necessary to intercept a voltage of $-(V0-V1\min)$ due to make the first nMOSFET 71 enter the off state by short-circuiting between the first gate terminal G1 and the first source terminal S1 to protect the battery safely.

To do so, it is necessary for the breakdown voltage $-BVds1$ of the first nMOSFET71 to satisfy the next expression (16).

$$BVds1 \geq V0 - V1\min \tag{16}$$

On the other hand, when the power supply is connected in reverse polarity, the potential of the first source terminal S1 becomes higher than that of the second drain terminal D2, and a voltage of $V0+V1\max$ is applied between S1 and D2 at the maximum. In other words, a voltage of $-(V0+V1\max)$ is applied between D2 and S2 of the second pMOSFET 76 at the maximum. In this case, it is only necessary to intercept a voltage of $V0+V1\max$ due to make the second pMOSFET 76 enter the off state by short-circuiting between the second gate terminal G2 and the second source terminal S2 to protect the battery safely.

To do so, it is necessary for the breakdown voltage $BVds2$ of the second pMOSFET76 to satisfy the next expression (17). In addition, the expression (18) is introduced by the expression (16) and the expression (17) as the relationship between BVds1 and BVds2.

$$BVds2 \geq V0 + V1\max \tag{17}$$

$$0 < BVds1 < BVds2 \tag{18}$$

The first MOSFET and the second MOSFET can be prevented from entering into an avalanche mode by designing the breakdown voltages of the first MOSFET and the second MOSFET as shown in each expression of the third embodiment through the eighth embodiment in the battery pack 80 of the configuration shown in FIG. 7 or FIG. 8. Thus, the battery can be protected safely.

In addition, according to the third embodiment and the sixth embodiment, the designed value of the breakdown voltage of the second MOSFET of the low breakdown voltage side can be reduced. According to the fourth embodiment, the fifth embodiment, the seventh embodiment, and the eighth embodiment, the designed value of the breakdown voltage of the first MOSFET of the low breakdown voltage side can be reduced. Thus, the on-resistance can be reduced in comparison with the conventional semiconductor device that the designed value of the breakdown voltage of the first MOSFET is the same as the second MOSFET. Alternatively because the size of a chip in which the semiconductor device according to the embodiments is provided can be reduced in the case that on-resistance of the semiconductor device according to the embodiments is the same as the conventional semiconductor device, the chip cost can be reduced.

As described above, the semiconductor device, the battery protection circuit and the battery pack according to the present invention are useful for a battery pack including a secondary battery used as the power supply for mobile devices and information equipment.

What is claimed is:

1. A semiconductor device, comprising:
a semiconductor member having a trench that extends to a common drain region at a bottom of the trench, the trench having first and second sidewalls, the member having first and second base regions of a first conductivity type adjacent the bottom of the trench and disposed at the first and second sidewalls of the trench respectively, the member additionally having first and second source regions of a second conductivity type, the first and second source regions being disposed at the first and second sidewalls of the trench respectively and on the first and second base regions respectively, the first and second source regions having first and second contact regions respectively;

a first gate insulating film portion on the first sidewall of the trench;

a first gate electrode on the first gate insulating film portion;

a first source electrode connected to the first contact region;

a second gate insulating film portion on the second sidewall of the trench;

a second gate electrode on the second gate insulating film portion; and a second source electrode connected to the second contact region, wherein a first transistor that is controlled by the first gate electrode has a breakdown voltage that is different from a breakdown voltage of a second transistor that is controlled by the second gate electrode, and wherein the trench follows a closed path that has first and second straight portions with ends, and first and second curved portions that join the ends of the first and second straight portions.

2. A semiconductor device according to claim 1, wherein the first conductivity type is p, the second conductivity type is n, and the trench extends around an island, the first base region and the first source region being located in the island.

3. A semiconductor device according to claim 2, wherein the second source electrode of the semiconductor device is connected to a minus terminal of a battery.

4. A semiconductor device, comprising:

a semiconductor member having a trench that extends to a common source region at a bottom of the trench, the trench having first and second sidewalls, the member having first and second base regions of a first conductivity type adjacent the bottom of the trench and disposed at the first and second sidewalls of the trench respectively, the member additionally having first and second drain regions of a second conductivity type, the first and second source regions being disposed at the first and second sidewalls of the trench respectively and on the first and second base regions respectively, the first and second drain regions having first and second contact regions respectively;

a first gate insulating film portion on the first sidewall of the trench;

a first gate electrode on the first gate insulating film portion;

a first drain electrode connected to the first contact region;

a second gate insulating film portion on the second sidewall of the trench;

a second gate electrode on the second gate insulating film portion; and a second drain electrode connected to the second contact region, wherein a first transistor that is controlled by the first gate electrode has a breakdown voltage that is different from a breakdown voltage of a second transistor that is controlled by the second gate electrode, wherein the trench follows a closed path that has first and second straight portions with ends, and first and second curved portions that join the ends of the first and second straight portions, and wherein the first conductivity type is p, the second conductivity type is n, and the trench extends around an island, the second base region and the second source region being located in the island.

5. A semiconductor device according to claim 4, wherein the second drain electrode of the semiconductor device is connected to a minus terminal of a battery.

6. A battery pack comprising the semiconductor device according to claim 1, and further comprising:

a control circuit connected to the semiconductor device; and a battery having a minus terminal that is connected to the second source electrode of the semiconductor device, wherein the battery pack has a minus terminal that is connected to the first source electrode of the semiconductor device.

7. A semiconductor device, comprising:

a semiconductor member having a trench that extends to a common source region of a first conductivity type at a bottom of the trench, the trench having first and second sidewalls, the member having first and second base regions of a second conductivity type adjacent the bottom of the trench and disposed at the first and second sidewalls of the trench respectively, the member additionally having first and second drain regions of a second conductivity type, the first and second drain regions being disposed at the first and second sidewalls of the trench respectively and on the first and second base regions respectively, the member further having a base contact region;

a first gate insulating film portion on the first sidewall of the trench;

a first gate electrode on the first gate insulating film portion;

a first principle electrode connected to the first drain region;

a second gate insulating film portion on the second sidewall of the trench;

a second gate electrode on the second gate insulating film portion;

a second principle electrode connected to the second drain region; and a conductive film connected to the common source and the base contact region, wherein a first transistor that is controlled by the first gate electrode has a breakdown voltage that is different from a breakdown voltage of a second transistor that is controlled by the second gate electrode, and wherein the trench follows a closed path that has first and second straight portions with ends, and first and second curved portions that join the ends of the first and second curved portions.

8. A semiconductor device according to claim 7, wherein the first conductivity type is n, the second conductivity type is p, and the trench extends around an island, the second base region and the second drain region being located in the island.

9. A semiconductor device according to claim 8, wherein the second principle electrode of the semiconductor device is connected to a minus terminal of a battery.

10. A semiconductor device according to claim 7, wherein the first conductivity type is n, the second conductivity type is p, and the trench extends around an island, the first base region and the first drain region being located in the island.

11. A semiconductor device according to claim 7, wherein the second principle electrode of the semiconductor device is connected to a minus terminal of a battery.

12. A battery pack comprising the semiconductor device according to claim 4, and further comprising:

a control circuit connected to the semiconductor device; and a battery having a minus terminal that is connected to the second drain electrode of the semiconductor device, wherein the battery pack has a minus terminal that is connected to the first drain electrode of the semiconductor device.

13. A semiconductor device according to claim 1, wherein the substrate has the first conductivity type and is provided with a well region of the second conductivity type, and wherein the common drain region is disposed in the well region and has the second conductivity type.

* * * * *